(12) United States Patent
Nirengi et al.

(10) Patent No.: US 11,479,860 B2
(45) Date of Patent: Oct. 25, 2022

(54) PATTERN PLATE FOR PLATING AND METHOD FOR MANUFACTURING WIRING BOARD

(71) Applicant: Panasonic Intellectual Property Management Co., Ltd., Osaka (JP)

(72) Inventors: Takayoshi Nirengi, Osaka (JP); Hideo Iguchi, Mie (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 17/415,556

(22) PCT Filed: Nov. 27, 2019

(86) PCT No.: PCT/JP2019/046283
§ 371 (c)(1),
(2) Date: Jun. 17, 2021

(87) PCT Pub. No.: WO2020/144960
PCT Pub. Date: Jul. 16, 2020

(65) Prior Publication Data
US 2022/0056586 A1    Feb. 24, 2022

(30) Foreign Application Priority Data

Jan. 10, 2019    (JP) .............................. JP2019-002739

(51) Int. Cl.
*C23C 18/31*    (2006.01)
*C23C 18/32*    (2006.01)
(Continued)

(52) U.S. Cl.
CPC .......... *C23C 18/1605* (2013.01); *C23C 18/32* (2013.01); *H05K 3/181* (2013.01); *H05K 3/20* (2013.01); *H05K 3/205* (2013.01)

(58) Field of Classification Search
CPC ....... C23C 18/31; C23C 18/32; C23C 18/161; C23C 18/165; C23C 18/1605;
(Continued)

(56) References Cited

U.S. PATENT DOCUMENTS 4,206,029 A * 6/1980 Spirig ....................... C25B 9/75
    204/290.01
4,308,122 A * 12/1981 Das Gupta .............. C25B 11/04
    204/290.13
(Continued)

FOREIGN PATENT DOCUMENTS

JP    2-159789    6/1990
JP    11-274694    10/1999
(Continued)

OTHER PUBLICATIONS

International Search Report of PCT application No. PCT/JP2019/046283 dated Feb. 4, 2020.

*Primary Examiner* — Xiaoliang Chen
(74) *Attorney, Agent, or Firm* — McDermott Will & Emery LLP

(57) ABSTRACT

A plating-pattern plate is configured to transfer, to a substrate, a transfer pattern formed by plating. The plating-pattern plate includes a base body and transfer parts disposed on the base body. Each of the transfer parts has a transfer surface configured to have the transfer pattern to be formed on the transfer surface by plating. The transfer parts are disposed electrically independent of one another on the base body. The plating-pattern plate provides a fine conductive pattern with stable quality.

27 Claims, 13 Drawing Sheets

(51) Int. Cl.
*H05K 3/06* (2006.01)
*H05K 3/20* (2006.01)
*H01L 21/60* (2006.01)
*H01L 21/62* (2006.01)
*H01L 51/52* (2006.01)
*H01L 51/56* (2006.01)
*G03G 13/16* (2006.01)
*G03G 13/28* (2006.01)
*C23C 18/16* (2006.01)
*H05K 3/18* (2006.01)

(58) Field of Classification Search
CPC .. C23C 18/1651; C23C 18/1653; H05K 3/06; H05K 3/20; H05K 3/0023; H05K 3/108; H05K 3/181; H05K 3/205; H05K 3/225; H05K 3/425; H05K 3/4644; H01L 21/60; H01L 21/62; H01L 21/6835; H01L 51/004; H01L 51/52; H01L 51/56; G03G 13/16; G03G 13/28; G03G 13/283
USPC .......... 165/540; 427/66, 130, 282, 554; 428/64.4, 65.1, 108, 826; 430/49.31, 430/322; 438/396, 406, 455; 156/540
See application file for complete search history.

(56) References Cited

U.S. PATENT DOCUMENTS

| | | | | |
|---|---|---|---|---|
| 4,714,798 A | * | 12/1987 | Novak | H01G 9/21 427/598 |
| 4,812,346 A | * | 3/1989 | Sudo | G11B 7/2533 |
| 4,847,171 A | * | 7/1989 | Schmatz | H01M 10/39 29/623.5 |
| 5,217,550 A | * | 6/1993 | Takeuchi | B41M 5/025 156/64 |
| 5,501,929 A | * | 3/1996 | Kato | G03G 13/283 430/49.31 |
| 5,506,071 A | * | 4/1996 | Tanaka | H01T 4/12 361/118 |
| 5,607,533 A | * | 3/1997 | Kato | G03G 13/283 156/239 |
| 5,620,822 A | * | 4/1997 | Kato | G03G 13/28 430/49.31 |
| 6,066,424 A | * | 5/2000 | Kato | G03G 13/283 430/49.31 |
| 6,378,199 B1 | * | 4/2002 | Yoshinuma | H05K 3/225 174/262 |
| 6,403,444 B2 | * | 6/2002 | Fukuzumi | H01L 28/82 257/E21.018 |
| 6,512,735 B1 | * | 1/2003 | Takeda | G11B 7/261 |
| 6,696,347 B1 | * | 2/2004 | Hikita | H01L 24/11 438/455 |
| 2006/0145611 A1 | * | 7/2006 | Joo | H01J 11/24 445/24 |
| 2007/0071884 A1 | * | 3/2007 | Takeshita | H01L 51/0004 313/504 |
| 2007/0242184 A1 | * | 10/2007 | Ohta | G02F 1/133606 349/64 |
| 2008/0265149 A1 | * | 10/2008 | Endoh | H01L 31/02366 359/896 |
| 2010/0124619 A1 | * | 5/2010 | Xu | C23C 18/31 427/75 |
| 2010/0239889 A1 | * | 9/2010 | Uchida | B29C 43/40 264/494 |
| 2011/0048962 A1 | * | 3/2011 | Reece | H01M 4/90 205/639 |
| 2011/0064871 A1 | * | 3/2011 | Uchida | G11B 5/855 428/447 |
| 2011/0175065 A1 | * | 7/2011 | de la Vega | H05B 33/26 257/E51.03 |
| 2011/0244614 A1 | * | 10/2011 | Adachi | H01L 27/1292 438/34 |
| 2012/0241409 A1 | * | 9/2012 | Kobayashi | H01L 51/003 216/37 |
| 2013/0026674 A1 | * | 1/2013 | Wakamatsu | B82Y 10/00 264/293 |
| 2013/0120485 A1 | * | 5/2013 | Kodama | G03F 7/0002 347/14 |
| 2013/0260290 A1 | * | 10/2013 | Shida | G03F 1/80 430/5 |
| 2014/0311258 A1 | * | 10/2014 | Oguchi | G01L 3/12 250/225 |
| 2014/0326988 A1 | * | 11/2014 | Yamaguchi | G02B 5/1809 257/40 |
| 2018/0210580 A1 | * | 7/2018 | Aridomi | B32B 27/08 |
| 2020/0053881 A1 | * | 2/2020 | Chung | H05K 3/108 |
| 2020/0082965 A1 | * | 3/2020 | Hussein | H01F 7/0242 |
| 2020/0083069 A1 | * | 3/2020 | Hussein | H01L 33/62 |

FOREIGN PATENT DOCUMENTS

| | | |
|---|---|---|
| JP | 2001-127409 | 5/2001 |
| JP | 2005-183512 | 7/2005 |
| JP | 2007-266324 | 10/2007 |
| JP | 4798439 B | 10/2011 |

* cited by examiner

·Removability-Enhancing Process

·1st Electroless Plating Process

·2nd Electroless Plating Process

·1st Blackening Process

·Transferring Process

·Removing Process

·2nd Blackening Process

FIG. 6A

| | Base Metal | Electroless Plating Process | Release Layer | Plating Temperature | States of Deposition | Removability |
|---|---|---|---|---|---|---|
| Example 1 | Iron 20%, Nickel 80% | Ni-P | No | 70°C | G | F |
| Example 2 | Iron 20%, Nickel 80% | Ni-P | Yes | 80°C | G | G |
| Example 3 | Iron 40%, Nickel 60% | Ni-P | Yes | 80°C | G | VG |
| Example 4 | Iron 60%, Nickel 40% | Ni-P | No | 80°C | G | VG |
| Example 5 | Iron 60%, Nickel 40% | Ni-P | Yes | 80°C | G | VG |
| Example 6 | Iron 60%, Nickel 40% | Ni-B | No | 75°C | G | VG |
| Example 7 | Iron 20%, Nickel 80% | Ni-B | Yes | 75°C | G | G |
| Comparative Example | Stainless Steel | Ni-P | No | 80°C | NG | NG |

- Removability-Enhancing Process

- 1st Electroless Plating Process

- 2nd Electroless Plating Process

- 1st Blackening Process

- Transferring Process

- Removing Process

- 2nd Blackening Process

·Removability-Enhancing Process

·1st Electroless Plating Process

·1st Blackening Process

·Transferring Process

·Removing Process

·2nd Electroless Plating Process

·2nd Blackening Process

·Imprint Process

·Film-Forming Process

·Electrolytic Plating Process

·Polishing Process

PATTERN PLATE FOR PLATING AND METHOD FOR MANUFACTURING WIRING BOARD

CROSS-REFERENCE TO RELATED APPLICATIONS

This application is a U.S. national stage application of the PCT international application No. PCT/JP2019/046283 filed on Nov. 27, 2019, which claims the benefit of foreign priority of Japanese patent application No. 2019-002739 filed on Jan. 10, 2019, the contents all of which are incorporated herein by reference.

TECHNICAL FIELD

The present invention relates to a plating-pattern plate and a method of manufacturing a wiring board.

BACKGROUND ART

In manufacturing of substrates with a conductor layer pattern, a method of forming a conductive pattern on a substrate by electrolytic plating is known (for example, see PTL 1).

CITATION LIST

Patent Literature

PTL 1: Japanese Patent No. 4798439

SUMMARY

A plating-pattern plate is configured to transfer, to a substrate, a transfer pattern formed by plating. The plating-pattern plate includes a base body and transfer parts disposed on the base body. Each of the transfer parts has a transfer surface configured to have the transfer pattern to be formed on the transfer surface by plating. The transfer parts are disposed electrically independent of one another on the base body.

The plating-pattern plate provides a fine conductive pattern with stable quality.

BRIEF DESCRIPTION OF DRAWINGS

FIG. 6A is a table showing conditions and evaluation results of a Comparative Example and Examples 1 to 7 of the plating-pattern plate according to Embodiment 1.

DETAIL DESCRIPTION OF PREFERRED EMBODIMENTS

Plating-pattern plates in accordance with aspects of the present disclosure will be described below with reference to accompanying drawings.

Note that the embodiments described hereinafter all illustrate specific examples of the present disclosure. Features such as numerical values, shapes, materials, constituent elements, layout positions and connection modes of the constituent elements, processes, and the order of the processes indicated in the following exemplary embodiments are merely examples, and are not intended to limit the present disclosure. Moreover, among the constituent elements in the following exemplary embodiments, constituent elements that are not described in the independent claim indicating the broadest concept of the present disclosure are described as arbitrary or optional constituent elements.

Exemplary Embodiment 1

1-1 Touch Panel

Figure 1:
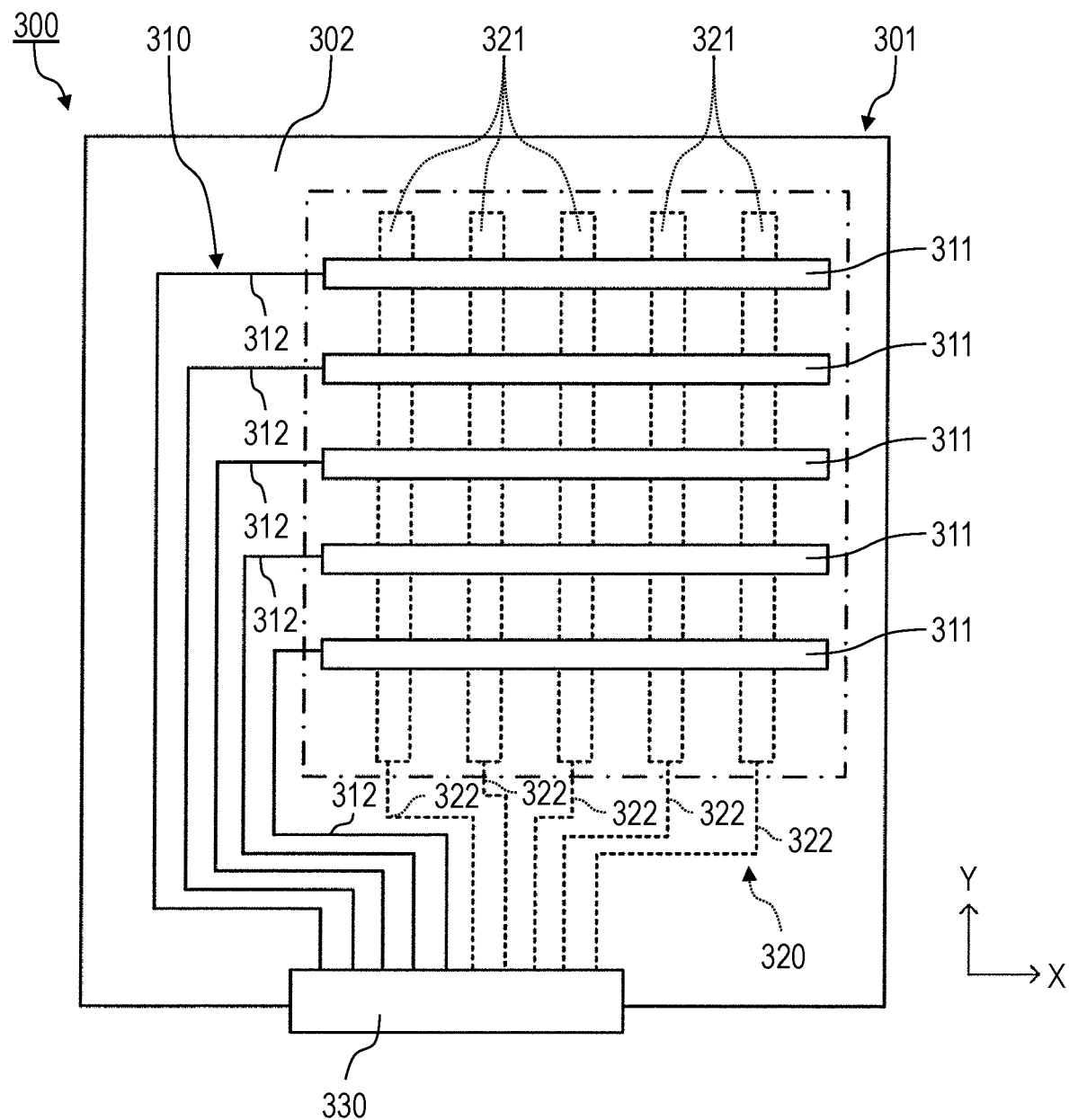
FIG. 1 is a plan view of a touch panel according to Exemplary Embodiment 1.

FIG. 1 is a plan view of touch panel 300 according to Exemplary Embodiment 1. In FIG. 1, a direction parallel to one side of touch panel 300 is an X-axis direction, and a direction perpendicular to the X-axis direction and parallel to another side of touch panel 300 is the Y-axis direction.

As shown in FIG. 1, touch panel 300 is a capacitive touch panel including wiring board 301. Wiring board 301 includes substrate 302, conductive pattern 310 disposed on one main surface of substrate 302, and conductive pattern 320 disposed on another main surface of substrate 302.

Conductive pattern 310 includes plural electrodes 311 arranged parallel to one another and plural lead wirings 312 each led out from a corresponding one of electrodes 311. Each of electrodes 311 is elongated along the X-axis direction, and is arranged along the Y-axis direction. Any one electrode of electrodes 311 and lead wiring 312 corresponding to the one electrode are disposed on substrate 302 so as to be electrically independent of other electrodes 311 and other lead wirings 312. That is, a pair of electrode 311 and lead wiring 312 are electrically independent of other pairs of electrodes 311 and lead wirings 312. Lead wirings 312 is electrically connected to flexible wiring board 330 disposed at one end of substrate 302.

Conductive pattern 320 includes plural electrodes 321 arranged parallel to one another, and plural lead wirings 322 each led out from a corresponding one of electrodes 321. Electrodes 321 are elongated along the Y-axis direction, and are arranged in the X-axis direction. Electrodes 321 are arranged in a direction perpendicular to the direction in which electrodes 311 are arranged. Any one electrode of electrodes 321 and lead wiring 322 corresponding to the one electrode are disposed on substrate 302 so as to be electrically independent of other electrodes 321 and other lead wirings 322. That is, a pair of electrode 321 and lead wiring 322 are electrically independent of other pairs of electrodes 321 and lead wirings 322. Lead wirings 322 are electrically connected to flexible wiring board 330 disposed at the one end of substrate 302.

In accordance with Embodiment 1, touch panel 300 is exemplarily described in which conductive pattern 310 is formed on one main surface of one substrate 302 and conductive pattern 320 is formed on another main surface. In the touch panel, conductive pattern 310 may be formed on a main surface of one of two substrates and conductive pattern 320 may formed on a main surface of the other substrate. In the touch panel, conductive pattern 310 may be formed on one main surface of substrate 302 and conductive pattern 320 may be formed on conductive pattern 310 via an insulating layer between conductive pattern 320 and conductive pattern 310.

1-2 Plating-Pattern Plate

Conductive pattern 310 is formed with a plating-pattern plate. The plating-pattern plate will be described below. The plating-pattern plate used for forming conductive pattern 320 is the same in basic configuration as the plating-pattern plate used for forming conductive pattern 310; therefore, the description of the former is omitted.

Figure 2:
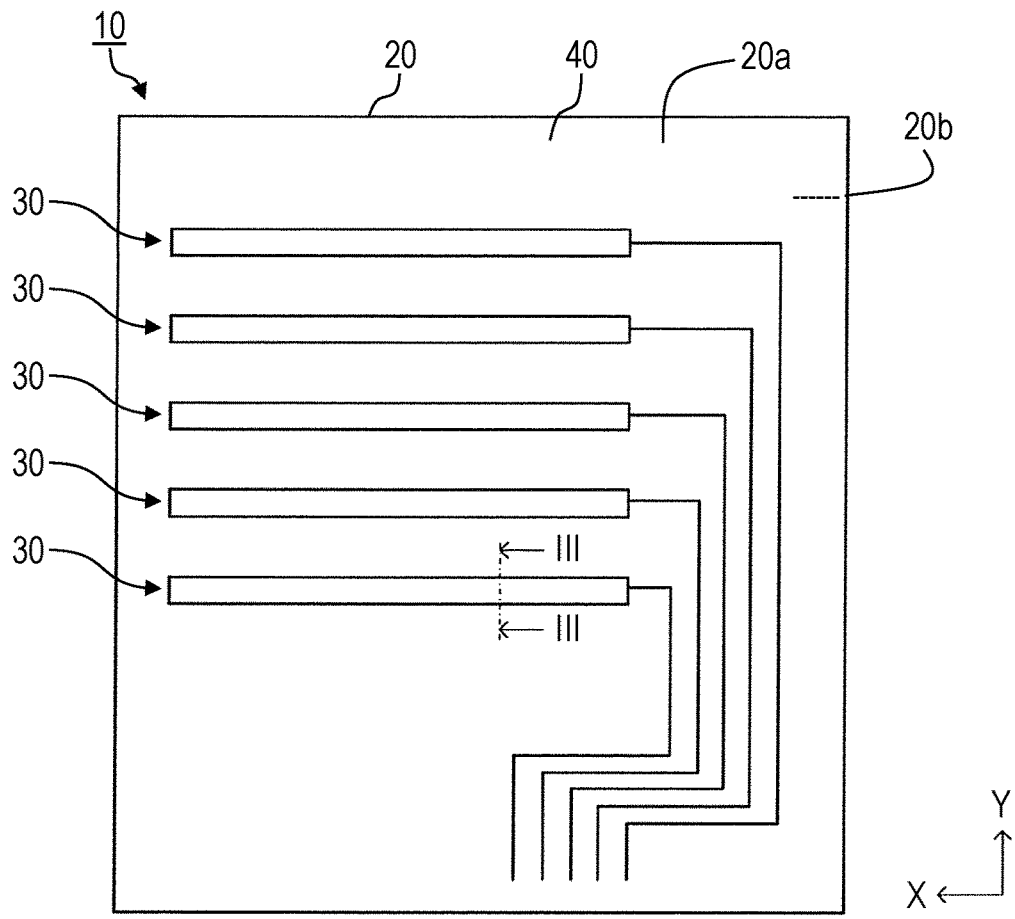
FIG. 2 is a plan view of a plating-pattern plate according to Embodiment 1.

FIG. 2 is a plan view of plating-pattern plate 10 for forming conductive pattern 310 according to Embodiment 1. For manufacturing touch panel 300, plating-pattern plate 10 is placed on one main surface of substrate 302. FIG. 2 illustrates plating-pattern plate 10 a state that the plate is flipped from substrate 302. Accordingly, in FIG. 2, the X-axis direction is opposite to that in FIG. 1.

As shown in FIG. 2, plating-pattern plate 10 includes base body 20, transfer parts 30, and resin part 40.

Base body 20 has a flat plate shape having main surfaces 20a and 20b opposite to each other. Transfer parts 30 are disposed on one main surface 20a of base body 20. Each of transfer parts 30 has a shape corresponding to respective one of pairs of electrode 311 and lead wiring 312 constituting conductive pattern 310. Transfer parts 30 are disposed on main surface 20a of base body 20 and are mutually electrically independent. In other words, transfer parts 30 do not electrically contact one another in main surface 20a of base body 20. In accordance with Embodiment 1, transfer parts 30 do not also physically contact one another, thus being disposed like islands. Resin part 40 is disposed on base body 20 and outside transfer parts 30 in a plan view.

Figure 3:
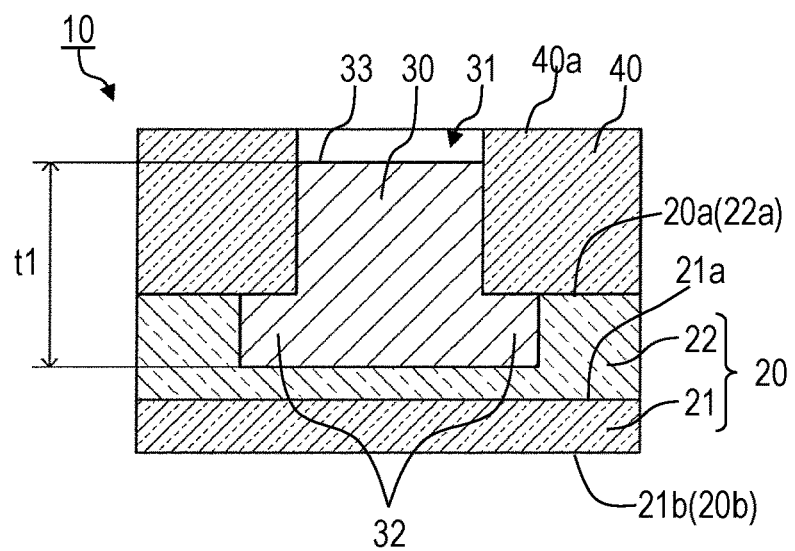
FIG. 3 is a partial cross-sectional view of the plating-pattern plate according to Embodiment 1.

Plating-pattern plate 10 will be detailed below. FIG. 3 is a partial cross-sectional view of plating-pattern plate 10 according to Embodiment 1. FIG. 3 particularly shows a cross section of plating-pattern plate 10 along line III-III shown in FIG. 2.

As shown in FIG. 3, plating-pattern plate 10 includes base body 20, base metal 31, and resin part 40. Base body 20 includes layer 21 and layer 22. Layer 21 is a supporter supporting materials constituting the pattern plate, and is made by, e.g. a metal plate, glass plate, or a film. The supporter preferably has a light-transmissive property, and may be made of glass plate or a light-transmissive film. Layer 22 is stacked to secure base metal 31 on main surface 21a of layer 21, and is made of any material capable of securing base metal 31; however, the layer preferably has an electrically insulating property and is made of, e.g. acrylic resin, epoxy resin, or silicone resin. Layer 22 preferably has a light-transmissive property. A part of base metal 31 is embedded in main surface 22a of layer 22 constituting main surface 20a of base body 20.

Base metal 31 includes transfer part 30 and a pair of projection parts 32 which protrude from respective end edges of a lower portion of transfer part 30. A top surface of transfer part 30 is transfer surface 33 and is exposed from resin part 40. A transfer pattern is formed on transfer surface 33 of transfer part 30 by electroless plating. That is, only transfer part 30 of base metal 31 contributes to the formation of the transfer pattern. In accordance with Embodiment 1, thickness t1 of transfer part 30 is preferably equal to or greater than 1 µm. This configuration enhances peelability of the transfer pattern. A thickness of transfer surface 33 equal to or greater than 0.1 µm allows transfer surface 33 to sufficiently exhibit a function allowing metal to be deposited thereon by plating, so that thickness t1 of transfer part 30 may be equal to or greater than 0.1 µm.

Base metal 31 may be made of any metal allowing a transfer pattern to be formed by electroless plating. In order to form patterned base metal 31, a metal which can be formed by plating is preferably used as the base metal. The material of base metal 31 may be alloy of iron and nickel. In accordance with Embodiment 1, base metal 31 is made of alloy containing iron and nickel at the content of a total of iron and nickel equal to or greater than 80%. The alloy forming base metal 31 may contain impurities at a content equal to or less than 20%. Base metal 31 is more preferably made of alloy in which the content of the total of iron and nickel is equal to or greater than 95%. In this case, the alloy that forms base metal 31 may contain impurities at a content equal to or less than 5%.

Resin part 40 is placed on layer 22 of base body 20 so as to expose transfer surface 33 of transfer part 30 therefrom. Surface 40a of resin part 40 is disposed at a position higher than transfer surface 33 of transfer part 30. That is, transfer surface 33 of transfer part 30 is recessed with respect to surface 40a of resin part 40. The recessing of transfer surface 33 with respect to surface 40a of resin part 40 prevents the line width of a transfer pattern from spreading when depositing the transfer pattern, hence forming of a fine wiring having a low resistance. Resin part 40 is made of photo-curable resin having removability. Resin part 40 may be made of photo-curable resin containing fluorine.

1-3 Method of Manufacturing Plating-Pattern Plate

Figure 4:
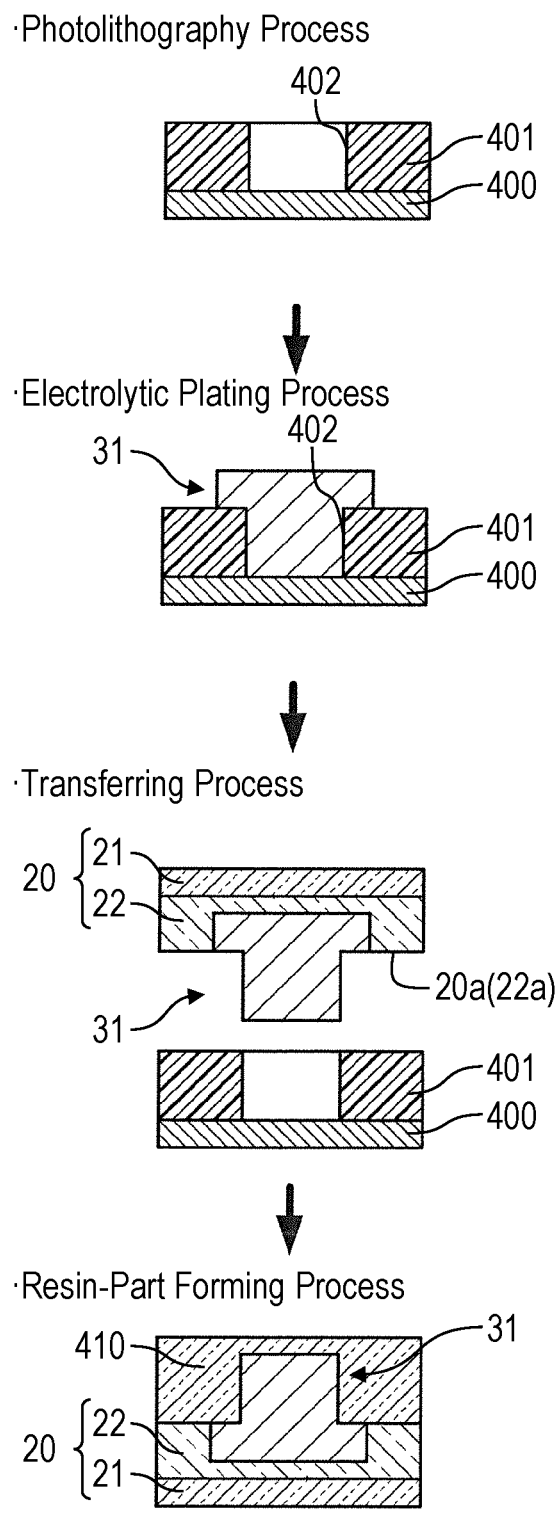
FIG. 4 illustrates a method of manufacturing the plating-pattern plate according to Embodiment 1.
Figure 4:
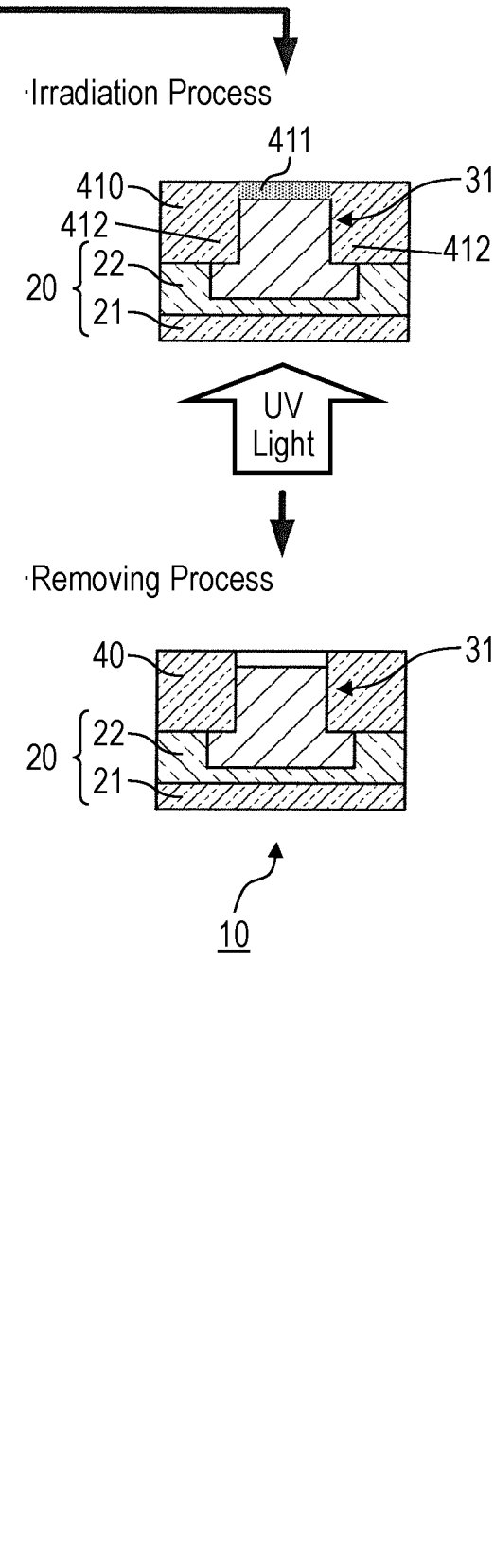

A method of manufacturing plating-pattern plate 10 according to Embodiment 1 will be described below. FIG. 4 illustrates processes of the method of manufacturing plating-pattern plate 10 according to Embodiment 1.

First, as shown in FIG. 4, in a photolithography process, electroforming substrate 400 is placed on patterning material 401 containing photosensitive substance. After that, patterning material 401 is subjected to photolithography to form opening 402 corresponding to a shape of transfer part 30. Electroforming substrate 400 is made of metal, such as copper, stainless steel, or nickel, having electrical conductivity sufficient to enable electrolytic plating. Electroforming substrate 400 may be formed by forming a conductive thin film made of, e.g. ITO, copper, nickel, or chromium, on a glass or resin substrate. Patterning material 401 may be made of any material on which a patterning process, such as photolithography, is performed. Specific examples of the material include reusable polyimide.

Next, in an electrolytic plating process, both electroforming substrate 400 and patterning material 401 are subjected to electrolytic plating to form base metal 31 in opening 402.

Next, in a transferring process, base metal 31 is transferred onto base body 20. Base metal 31 is transferred onto layer 22 such that projection parts 32 of base metal 31 are flush with main surface 22a of layer 22, i.e., main surface 20a of base body 20. As a result, a part of base metal 31 is embedded in layer 22 of base body 20 while a part of transfer part 30 protrudes from layer 22.

Next, in a resin-part forming process, photo-curable resin 410 constituting resin part 40 is applied onto base body 20 so as to cover both layer 22 and base metal 31.

Next, in an irradiation process, base metal 31 is irradiated with light (for example, ultraviolet light: UV light) through base body 20, thereby curing a part of photo-curable resin 410. Base metal 31 blocks the light. Portions 412 of photo-curable resin 410 on which projection parts 32 of base metal 31 are placed reliably have thicknesses large enough to allow the light to enter there from the outside of the portions. This configuration allows portions 412 to be cured with the light. Consequently, region 411 of photo-curable resin 410 on which transfer part 30 is placed does not receive an enough amount of the light to cure the resin, consequently causing the resin in region 411 to remain uncured.

Next, in a removing process, photo-curable resin 410 is washed with solvent to remove the uncured resin, i.e., photo-curable resin 410 in region 411. As a result, the remaining part of photo-curable resin 410 becomes resin part 40, thus providing plating-pattern plate 10.

1-4 Method of Manufacturing Wiring Board

Figure 5:
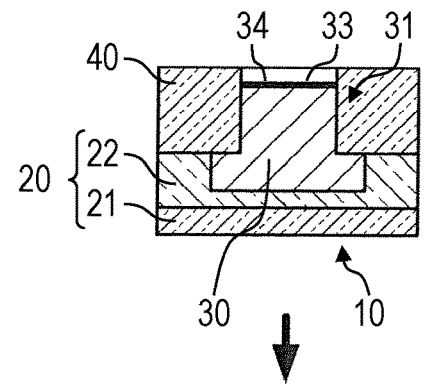
FIG. 5 illustrates a method of manufacturing a wiring board according to Embodiment 1.
Figure 5:
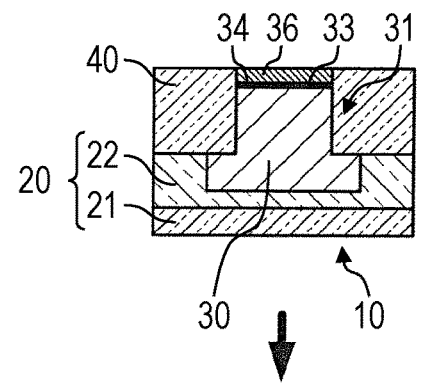
Figure 5:
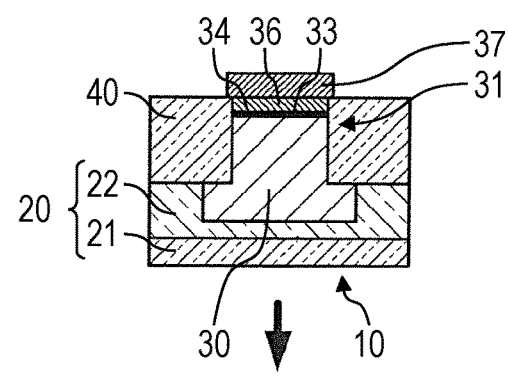
Figure 5:
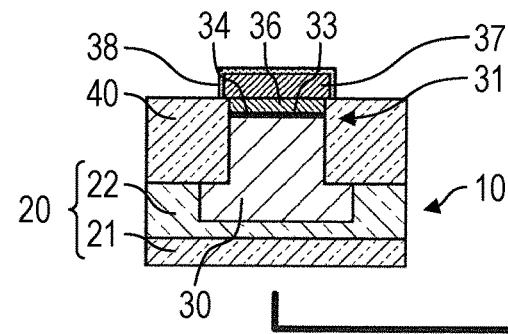
Figure 5:
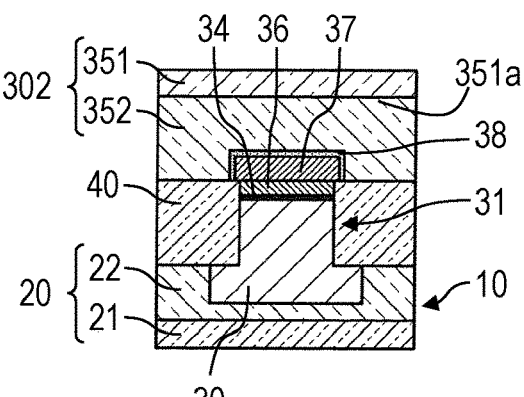
Figure 5:
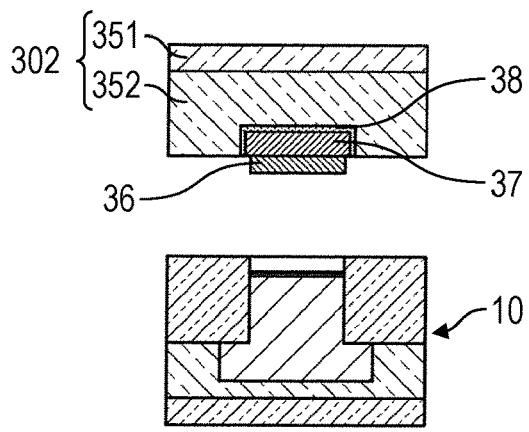
Figure 5:
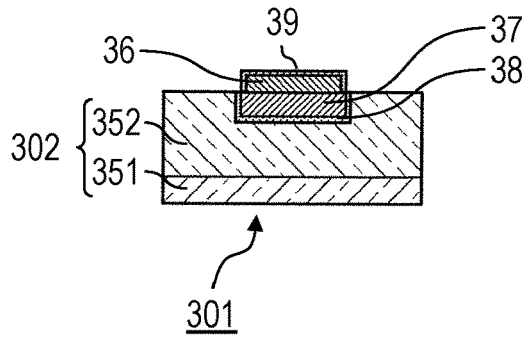

A method of manufacturing a wiring board with plating-pattern plate 10 according to Embodiment 1 will be described below. FIG. 5 illustrates processes for manufacturing wiring board 301 according to Embodiment 1.

As shown in FIG. 5, in a removability-enhancing process, transfer surface 33 of transfer part 30 is subjected to a removability-enhancing process. The removability-enhancing process is a process for enhancing removability of a transfer pattern against transfer surface 33. In the removability-enhancing process, thiazole-based release agent is applied on transfer surface 33 to form release layer 34. The removability-enhancing process not limited only to the application of the release agent, but may be a treatment of reforming transfer surface 33 to enhance the removability.

Next, in a first electroless plating process, plating-pattern plate 10 with release layer 34 is immersed in a plating solution containing nickel, thereby being subjected to electroless plating, resulting in the formation of transfer pattern 36 on release layer 34. However, instead of the electroless plating, electrolytic plating may be performed to form transfer pattern 36 on release layer 34. In this case, the first electroless plating process is replaced with a plating process. Through this process, transfer pattern 36 is formed over transfer surface 33 of transfer part 30. That is, transfer pattern 36 is formed on transfer surface 33 of transfer part 30 via release layer 34 between transfer pattern 36 and transfer surface 33. Transfer pattern 36 becomes an electroless nickel film that is a thin-film layer containing nickel. In the electroless plating, in the case that the plating solution contains dimethylamine borane as a reducing agent, it causes transfer pattern 36 to become an electroless nickel film that is a thin-film layer containing nickel and boron. In the electroless plating, in the case that the plating solution contains hypophosphite as a reducing agent, it causes transfer pattern 36 to become an electroless nickel film that is a thin-film layer containing nickel and phosphorus. In order to deposit these electroless nickel films onto transfer surface 33, base metal 31 exhibits plating-active properties for the electroless plating solutions. Specifically, base metal 31 has a catalytic action on the oxidation of the reducing agents. In accordance with the present disclosure, a preferable form of base metal 31 has been found in view of achievement of both the plating deposition action and the peeling properties, and thus it will be described in Examples below.

Next, in a second electroless plating process, plating-pattern plate 10 with transfer pattern 36 is immersed in a plating solution containing copper, for example, thereby being subjected to electroless plating, providing conductive pattern 37 on transfer pattern 36. Conductive pattern 37 may be made of any metal other than copper as long as it is formable by electroless plating and is electrically conductive. Examples of the material of conductive pattern 37 other than copper include, for example, gold and silver. Copper, gold, and silver having relatively high electrical conductivity are preferably used as the material for conductive pattern 37.

Next, in a first blackening process, blackened layer 38 is formed on conductive pattern 37. Blackened layer 38 may be formed by displacement plating with palladium or, alternatively, formed by etching or any other treatment on the surface layer of conductive pattern 37 to roughen a surface of conductive pattern 37. In the case where conductive pattern 37 per se is black, blackened layer 38 is not necessary.

Next, in a transferring process, substrate 302 constituting wiring board 301 is pressed against plating-pattern plate 10 that is provided with release layer 34, transfer pattern 36, conductive pattern 37, and blackened layer 38. Substrate 302 includes base body 351 having a flat-plate shape and transfer resin layer 352 placed on one main surface 351a of base body 351. Base body 351 is made of resin, glass, or metal. Transfer resin layer 352 is made of material securing conductive pattern 37 which has been transferred. Transfer resin layer 352 is made of thermosetting resin such as epoxy, photo-curable resin, or heat seal material. From the standpoint of ease of manufacture, transfer resin layer 352 is preferably made of photo-curable resin.

In the transferring process, upon pressing of substrate 302 against plating-pattern plate 10, blackened layer 38 and conductive pattern 37 are embedded inside transfer resin layer 352.

Next, in a removing process, substrate 302 is peeled off from plating-pattern plate 10. In this process, blackened layer 38, conductive pattern 37, and transfer pattern 36 are unitarily secured on substrate 302. At the time of the releasing, transfer pattern 36 is peelable from transfer surface 33 of base metal 31. This allows transfer pattern 36 to be uniformly peeled off transfer surface 33. Release layer 34 formed on plating-pattern plate 10 allows transfer pattern 36 to be uniformly peeled off from transfer surface 33. That is, transfer pattern 36 is prevented from being partially left on transfer surface 33. Since resin part 40 contains fluorine, resin part 40 can be uniformly detached from substrate 302.

Next, in a second blackening process, blackened layer 39 is formed on transfer pattern 36. Blackened layer 39 may be formed by displacement plating with palladium or, alternatively, formed by etching or any other treatment on the surface layer of transfer pattern 36 to roughen a surface of the pattern. In the case where transfer pattern 36 per se is black, blackened layer 39 is not necessary. The above thus processes provide wiring board 301.

1-5 Examples

Peelability of base metal 31 and the transfer metal (transfer pattern 36) according to the embodiment will be described below. The transfer metal discussed here employs an unpatterned solid film constituting transfer pattern 36. Electroless nickel plating is useful to deposit a patterned plating onto base metal 31 that has formed in a pattern. On the other hand, in order to deposit an electroless nickel film, base metal 31 exhibits plating-active properties for the electroless plating solution. Specifically, base metal 31 has a catalytic action on the oxidation of a reducing agent. The thus-deposited plating film is required to be peelable. Hereinafter, the preferable form of base metal 31 required to achieve both the plating deposition action and the peeling properties will be described in Examples 1 to 7 and a Comparative Example. FIG. 6A is a table showing the conditions and evaluation results of Examples 1 to 7 and the Comparative Example. Note that, in Examples 1 to 7, Hull cell panels on which Fe—Ni electrolytic plating films had been deposited in predetermined proportions were used as base metals 31. In the Comparative Example, stainless foil of SUS 304 was used as base metal 31.

Base metal 31 of Example 1 is made of alloy containing iron and nickel at the content of the total of iron and nickel equal to or greater than 80%, and the ratio of iron to nickel is 20/80. Base metal 31 of Example 1 was subjected, without forming release layer 34, to the first electroless plating process in a plating solution that contains nickel and phosphorus. As a result, the transfer metal has become a thin-film layer containing nickel and phosphorus. The temperature of the plating solution at that time was 70° C. The transfer metal has been evaluated for the state of deposition. FIG. 6A shows the states of deposition evaluated in terms of the following levels. "NG" represents the level in which the electroless Ni film has not been deposited to form as a uniform film, "G" represents the level in which the electroless Ni film has been deposited to form as a uniform film.

After the transfer metal had been formed, the transferring process and the removing process were performed, followed by evaluating the transfer metal for mold-release properties. In the evaluation for removability, "NG" represents the state, after the removing process, in which no transfer metal has been transferred to substrate 302 even partially. "F" represents the state, after the removing process, in which the transfer metal has been transferred to substrate 302 as a whole even non-uniformly. "G" represents the state, after the removing process, in which the transfer metal has been transferred to substrate 302 as a whole substantially uniformly. "VG" represents the state, after the removing process, in which the transfer metal has been transferred to substrate 302 as a whole uniformly. The state of deposition represented by "NG", since deposited transfer metal was absent in the first place, the evaluation for removability is indicated as "NG".

Base metal 31 of Example 2 is made of alloy in which the percentage content of the total of iron and nickel is equal to or greater than 80% and the ratio of iron to nickel is 20/80. Release layer 34 was formed on base metal 31 of Example 2, followed by subjecting it to the first electroless plating process in a plating solution that contains nickel and phosphorus. As a result, the transfer metal has become a thin-film layer containing nickel and phosphorus. The temperature of the plating solution at that time was 80° C. The evaluation result of Example 2 is that the state of deposition is in the level of "G", and that the removability is in the level of "G".

Base metal 31 of Example 3 is made of alloy in which the percentage content of the total of iron and nickel is equal to or greater than 80% and the ratio of iron to nickel is 40/60. Release layer 34 was formed on base metal 31 of Example 3, followed by subjecting it to the first electroless plating process in a plating solution that contains nickel and phosphorus. As a result, the transfer metal has become a thin-film layer containing nickel and phosphorus. The temperature of the plating solution at that time was 80° C. The evaluation result of Example 3 is that the state of deposition is in the level of "G", and that the removability is in the level of "VG".

Base metal 31 of Example 4 is made of alloy in which the percentage content of the total of iron and nickel is equal to or greater than 80% and the ratio of iron to nickel is 60/40. Base metal 31 of Example 4 was subjected, without forming release layer 34, to the first electroless plating process in a plating solution that contains nickel and phosphorus. As a result, the transfer metal has become a thin-film layer containing nickel and phosphorus. The temperature of the plating solution at that time was 80° C. The evaluation result of Example 4 is that the state of deposition is in the level of "G", and that the removability is in the level of "VG".

Base metal 31 of Example 5 is made of alloy in which the percentage content of the total of iron and nickel is equal to or greater than 80% and the ratio of iron to nickel is 60/40. Release layer 34 was formed on base metal 31 of Example 5, followed by subjecting it to the first electroless plating process in a plating solution that contains nickel and phosphorus. As a result, the transfer metal has become a thin-film layer containing nickel and phosphorus. The temperature of the plating solution at that time was 80° C. The evaluation result of Example 5 is that the state of deposition is in the level of "G", and that the removability is in the level of "VG".

Base metal 31 of Example 6 is made of alloy in which the percentage content of the total of iron and nickel is equal to or greater than 80% and the ratio of iron to nickel is 60/40. Base metal 31 of Example 6 was subjected, without forming release layer 34, to the first electroless plating process in a plating solution that contains nickel and boron. As a result, the transfer metal has become a thin-film layer containing nickel and boron. The temperature of the plating solution at that time was 75° C. The evaluation result of Example 6 is that the state of deposition is in the level of "G", and that the removability is in the level of "VG".

Base metal 31 of Example 7 is made of alloy in which the percentage content of the total of iron and nickel is equal to or greater than 80% and the ratio of iron to nickel is 20/80. Release layer 34 was formed on plating-pattern plate 10 of Example 7, followed by subjecting it to the first electroless plating process in a plating solution that contains nickel and boron. As a result, the transfer metal has become a thin-film layer containing nickel and boron. The temperature of the plating solution at that time was 75° C. The evaluation result of Example 7 is that the state of deposition is in the level of "G", and that the removability is in the level of "G".

The Comparative Example is different from the Examples in that base metal 31 is made of stainless steel. Base metal 31 of the Comparative Example was subjected, without forming release layer 34, to the first electroless plating process in a plating solution that contains nickel and phosphorus. The temperature of the plating solution at that time was 70° C. The evaluation result of the Comparative Example is that the state of deposition is in the level of "NG", and that the removability is in the level of "NG".

In Examples 1 to 7, although the transfer metal contains nickel, peelable transfer metal is not deposited. A thin oxide film is formed on base metals 31 made of Fe—Ni alloys, which reduces the adhesion properties of the electroless Ni films. However, due to the Fe—Ni alloy with strong catalytic action on the reducing agents, the electroless Ni film is deposited through a self oxidation-reduction action. As a result, it is thought that the deposited electroless Ni films have not so strong adhesion to base metals 31 that they are prone to peeling off. In the SUS stainless, the Ni—P plating film is less prone to be deposited. This is because an excessive amount of the oxide film is formed on the surface or, alternatively, the SUS stainless contains so much of inactive-for-plating metals that it has poor catalytic action on the plating relative to the Fe—Ni alloys. In particular, it can be seen that, even without release layers 34, base metals 31 can exhibit a certain degree of removability as long as the percentage content of iron is equal to or greater than 20%.

1-6 Advantageous Effects

As described above, plating-pattern plate 10 according to Embodiment 1 is configured to transfer, to substrate 302 constituting wiring board 301, transfer pattern 36 formed by electroless plating. The plating-pattern plate includes base body 20 and transfer parts 30 disposed on base body 20. The transfer parts 30 are for transferring formed transfer pattern 36. The transfer parts 30 are electrically independent of one another on base body 20.

The transfer parts 30 electrically independent of one another on base body 20, even if a defect such as a disconnection or short circuit occurs during the manufacturing of plating-pattern plate 10, the location of such a defect can be easily found by an electrical inspection, such as a conductivity inspection. In contrast, in the case where transfer parts 30 are electrically connected to one another, transfer parts 30 are not evaluated for a disconnection and short circuit, resulting in the difficulty of inspection of plating-pattern plate 10 for defects.

Plating-pattern plate 10 is configured to transfer, to substrate 302 constituting wiring board 301, transfer pattern 36 formed by plating. Plating-pattern plate 10 includes transfer parts 30 disposed on light-transmissive base body 20.

When light is applied through base body 20 during the manufacture of plating-pattern plate 10, the transfer parts 30 disposed on light-transmissive base body 20 block the light.

For example, in the case where a photoreactive resin (photo-curable resin 410) is laminated to cover a surface of base body 20 having transfer parts 30 provided thereon, portions of curable resin 410 located on transfer parts 30 do not react since transfer parts 30 block the light. This configuration allows uncured photo-curable resin 410 to be removed easily in the subsequent steps. Therefore, it is possible to reliably expose, from photo-curable resin 410, contribute-to-transfer transfer surface 33 of each of transfer parts 30. Transfer pattern 36 is formed on each of thus-exposed transfer surfaces 33 by electroless plating. Conductive pattern 37 is formed on top of transfer pattern 36. As long as each of transfer surfaces 33 are reliably exposed, both transfer pattern 36 and conductive pattern 37 are formed accurately, providing even fine conductive pattern 37 with stable quality.

Plating-pattern plate 10 according to Embodiment 1 is configured to transfer, to substrate 302 constituting wiring board 301, transfer pattern 36 formed by plating. The plating-pattern plate includes light-transmissive base body 20 and transfer part 30 disposed on base body 20. Transfer pars 30 is for transferring formed transfer pattern 36.

Since transfer part 30 is disposed on light-transmissive base body 20, when light is applied through base body 20 during the manufacture of plating-pattern plate 10, transfer part 30 blocks the light. For example, in the case where a photoreactive resin (photo-curable resin 410) is laminated to cover aforementioned transfer part 30 on a surface of base body 20 having the transfer part 30 provided thereon, a portion of photo-curable resin 410 located on transfer parts 30 does not react since transfer pars 30 blocks the light. This configuration allows thus-uncured photo-curable resin 410 to be removed easily in the subsequent steps. Therefore, it is possible to reliably expose, from photo-curable resin 410, contribute-to-transfer transfer surfaces 33 of transfer parts 30. Transfer pattern 36 is formed on thus-exposed transfer surfaces 33 by electroless plating. Conductive pattern 37 is formed on top of transfer pattern 36. As long as transfer surfaces 33 have been reliably exposed, both transfer pattern 36 and conductive pattern 37 are formed accurately, providing fine conductive pattern 37 with stable quality.

It has been desired to make the conductive patterns finer; unfortunately, the actual situation is that the quality varies in cases where the conductive patterns are formed simply by electrolytic plating.

Plating-pattern plate 10 according to Embodiment 1 provides fine conductive pattern 37 with stable quality.

Transfer parts 30 is made of alloy of iron and nickel.

This configuration enhances peelability of transfer pattern 36 that has been formed on transfer part 30 by electroless plating. As a result, transfer pattern 36 is uniformly peeled off from transfer part 30, resulting in transfer pattern 36 with high quality. This configuration stabilizes the quality of fine conductive pattern 37 that is subsequently formed on transfer pattern 36.

Transfer part 30 is formed by electroplating.

Transfer part 30 even formed by electroplating enhances removability of transfer pattern 36 having been formed on transfer part 30 by plating.

Transfer part 30 is made of alloy of iron and nickel in which the percentage content of the total of the iron and nickel is not less than 80%.

This configuration enhances peelability of transfer pattern 36 having been formed on transfer part 30 by electroless plating.

Transfer part 30 is made of an alloy in which the ratio of iron to the content of the total of iron and nickel is equal to or larger less than 20%.

This configuration enhances the peelability of transfer part 30 from transfer pattern 36 having been formed on transfer part 30 by plating.

The transfer part has a thickness equal to or larger than 1 μm. However, as described above, the thickness of the transfer part 30 may be equal to or larger than 0.1 μm.

This configuration enhances the peelability of transfer pattern 36 having been formed on transfer part 30 by electroless plating.

Plating-pattern plate 10 includes resin part 40 disposed outside transfer parts 30 in a plan view. Resin part 40 contains fluorine.

This configuration enhances the peelability of substrate 302 which has been placed on resin part 40 when transferring transfer pattern 36. This configuration maintains the quality of transfer pattern 36 after having been transferred.

A method of manufacturing wiring board 301 according to Embodiment 1 includes the first electroless plating process of forming transfer pattern 36 on transfer part 30 of plating-pattern plate 10 by electroless plating, the transferring process of transferring transfer pattern 36 to substrate 302, and the second electroless plating process of forming conductive pattern 37 on transfer pattern 36 by electroless plating.

In this configuration, as described above, transfer pattern 36 is formed, by plating, on transfer part 30 of on plating-pattern plate 10 from which transfer surface 33 has been reliably exposed, which allows fine transfer pattern 36 to be formed accurately. Conductive pattern 37 is formed on transfer pattern 36 by electroless plating, increasing accuracy of conductive pattern 37. Therefore, even fine conductive pattern 37 has a stable quality.

Before the first electroless plating process, the removability enhancing process may be performed to subject transfer part 30 to the removability enhancing treatment.

In this configuration, release layer 34 allows transfer pattern 36 to be reliably peeled off transfer part 30. Therefore, it is possible to uniformly peel transfer pattern 36 from transfer part 30, resulting in a more enhanced quality of transfer pattern 36.

Wiring board 301 is a wiring board for use in a touch panel.

According to this, even with the wiring board for touch panel, it is possible to stabilize the quality of fine conductive pattern 37.

Figure 6B:
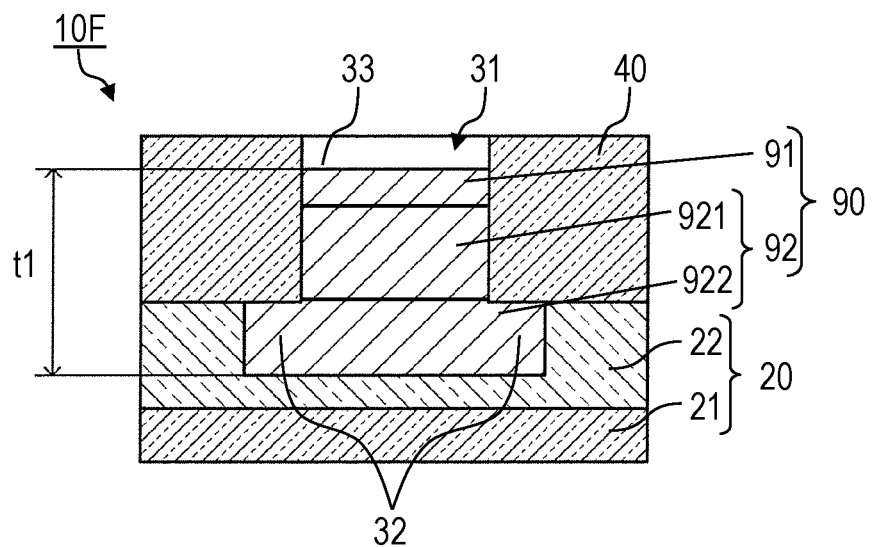
FIG. 6B is a partial cross-sectional view of another plating-pattern plate according to Embodiment 1.

FIG. 6B is a partial cross-sectional view of another plating-pattern plate 10F according to Embodiment 1. In FIG. 6B, components identical to those of plating-pattern plate 10 shown in FIG. 3 are denoted by the same numerals. Plating-pattern plate 10F includes transfer parts 90 instead of transfer parts 30 of plating-pattern plate 10 shown in FIGS. 2 to 5. In the case where the thickness of the transfer parts is equal to or greater than 1 μm, each of the transfer parts may be made of metal layers that are laminated. Transfer part 90 of plating-pattern plate 10F shown in FIG. 6B includes metal layer 91 and metal layer 92 having metal layer 91 placed thereon. Metal layer 92 supports metal layer 91. Metal layer 91 has transfer surface 33 and contains iron and nickel. Metal layer 92 includes one or more layers. In plating-pattern plate 10F, metal layer 92 includes two layers 921 and 922 that are stacked on each other. For example, in the case where the thickness of transfer part 30 is 3 μm, metal layer 91 is made of alloy of iron and nickel constituting transfer surface 33 and has a thickness of 0.2 μm, and metal layer 92 is made of nickel and has a thickness of 2.8 μm.

Exemplary Embodiment 2

2-1 Plating-Pattern Plate

Figure 7:
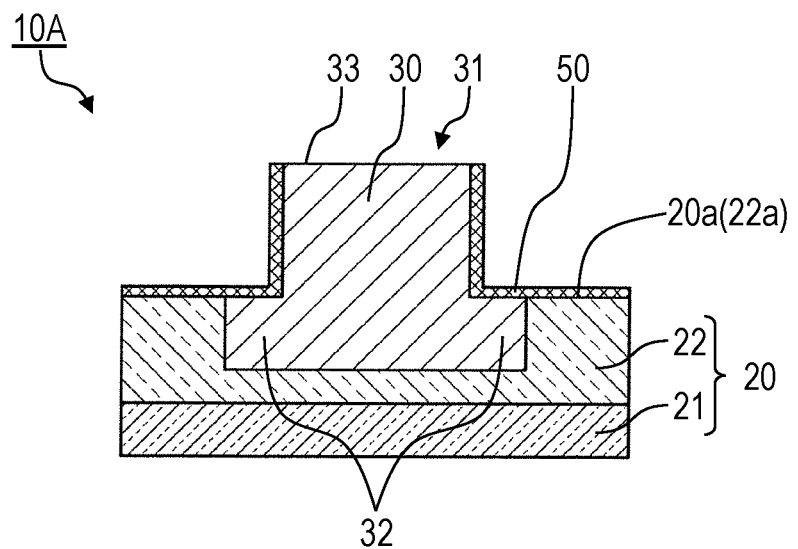
FIG. 7 is a partial cross-sectional view of a plating-pattern plate according to Exemplary Embodiment 2.

FIG. 7 is a partial cross-sectional view of plating-pattern plate 10A according to Exemplary Embodiment 2 for illustrating a partial schematic configuration thereof. FIG. 7 corresponds to FIG. 3. In the following descriptions, components identical to those described in Embodiment 1 are denoted by the same reference numerals, and their explanation may be omitted.

As shown in FIG. 7, plating-pattern plate 10A includes base body 20, base metal 31, and inorganic film 50. Inorganic film 50 covers side surfaces of transfer part 30 of base metal 31, upper surfaces of a pair of projection parts 32, and upper surfaces (main surface 20a) of base body 20 such that transfer surface 33 of base metal 31 is exposed through the film. Inorganic film 50 is made of inorganic material having electrical insulative property. Inorganic film 50 may be, e.g. a Diamond Like Carbon (DLC) film or a sputtered film.

2-2 Method of Manufacturing Plating-Pattern Plate

Figure 8:
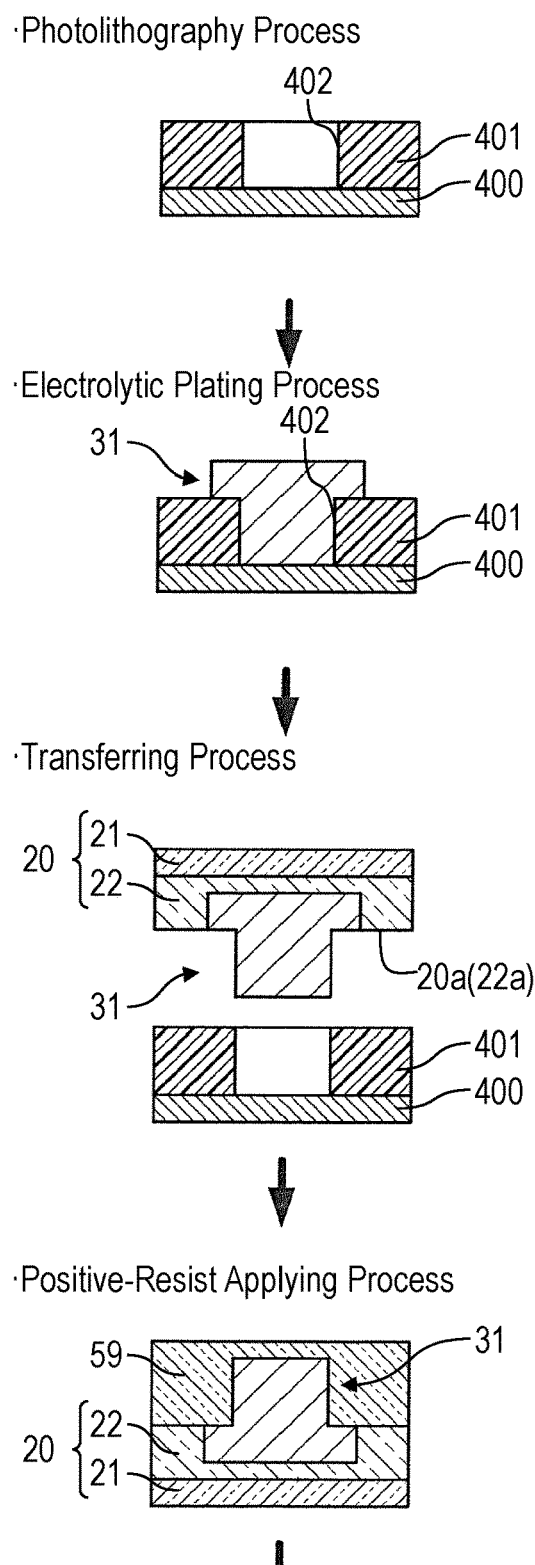
FIG. 8 illustrates a method of manufacturing the plating-pattern plate according to Embodiment 2.
Figure 8:
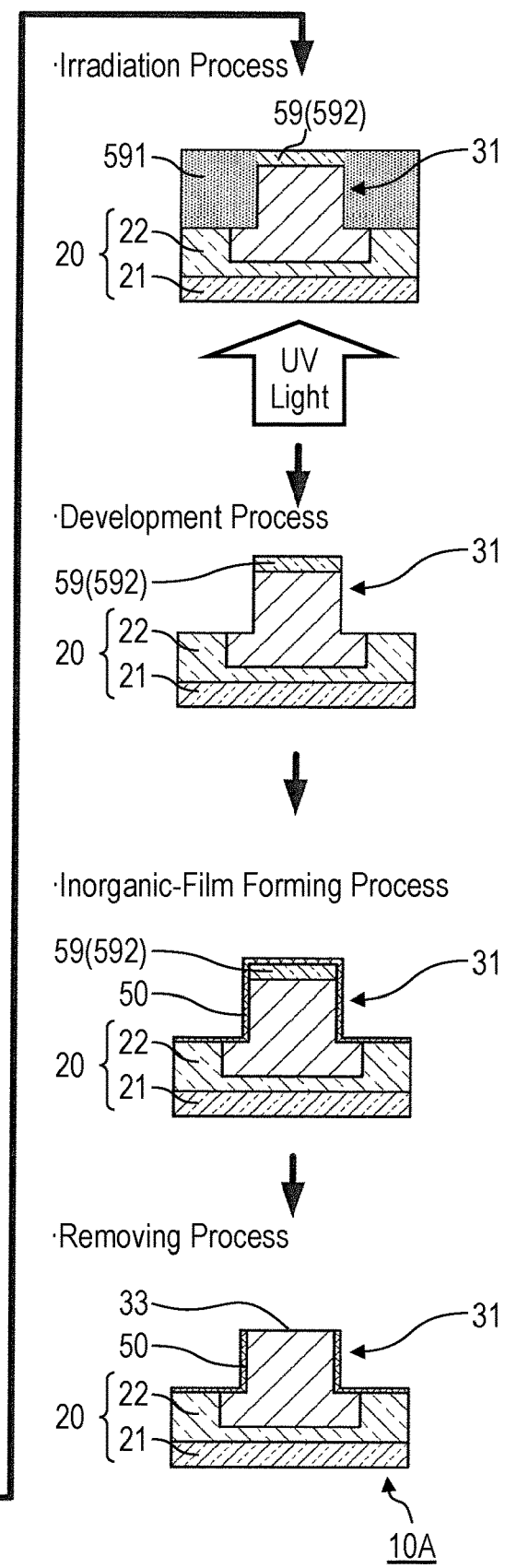

A method of manufacturing plating-pattern plate 10A according to Embodiment 2 will be described below. FIG. 8 illustrates processes of the method of manufacturing plating-pattern plate 10A according to Embodiment 2.

As shown in FIG. 8, in a photolithography process, patterning material 401 containing photosensitive substance is placed on electroforming substrate 400. After that, patterning material 401 is subjected to photolithography such that opening 402 corresponding to the shape of transfer part 30 is formed. Electroforming substrate 400 is made of metal having electrical conductivity sufficient for electrolytic plating. Such a metal may be copper, stainless steel, or nickel. Patterning material 401 may be any material capable of being subjected to patterning processing such as photolithography. Specific examples of the material include reusable polyimide.

Next, in an electrolytic plating process, both electroforming substrate 400 and patterning material 401 are subjected to electrolytic plating to form base metal 31 in opening 402.

Next, in a transferrin process, base metal 31 is transferred to base body 20. Base metal 31 is transferred to layer 22 such that projection parts 32 of base metal 31 are flush with main surface 22a of layer 22, i.e., main surface 20a of the base body. As a result, a part of base metal 31 is embedded in layer 22 of base body 20 while a part of transfer part 30 protrudes from layer 22.

Next, in a positive-resist applying process, positive resist 59 is applied onto base body 20 so as to cover both layer 22 and base metal 31. Positive resist 59 is a positive-type photosensitive material, and preferably enables a lift-off process easily.

Next, in an irradiation process, base metal 31 is irradiated with light (for example, ultraviolet light: UV light) through base body 20. At this moment, since base metal 31 blocks the light, a part of positive resist 59 which receives the light increases in solubility characteristics. That is, region 591 of positive resist 59 on which transfer part 30 is not superposed is reacted so as to increase in solubility characteristics, but region 592 of positive resist 59 on which transfer part 30 is superposed remains unreacted.

Next, in a development process, positive resist 59 with thus-increased solubility characteristics of region 591 is removed with a developing solution. This causes thus-unreacted positive resist 59 of region 592 to be left only on transfer part 30.

Next, in an inorganic-film forming process, inorganic film 50 is formed on the upper surface of base body 20, the side surfaces of base metal 31, and an exposed upper surface of positive resist 59.

Next, in a removing process, positive resist 59 is removed by peeling or polishing to expose transfer surface 33 of transfer part 30, thus providing plating-pattern plate 10A. Plating-pattern plate 10A according to Embodiment 2 provides the same functional advantages as plating-pattern plate 10 according to Embodiment 1.

2-3 Manufacturing Method 1 of Wiring Board

Figure 9:
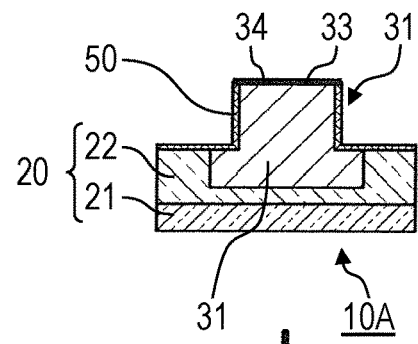
FIG. 9 illustrates a method of manufacturing a wiring board according to Embodiment 2.
Figure 9:
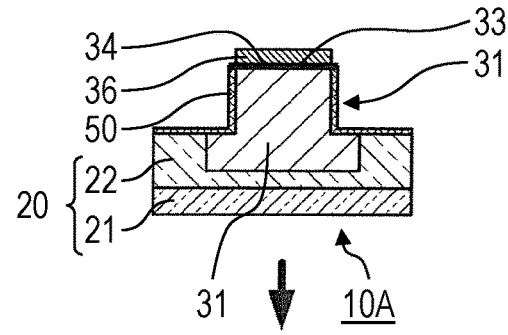
Figure 9:
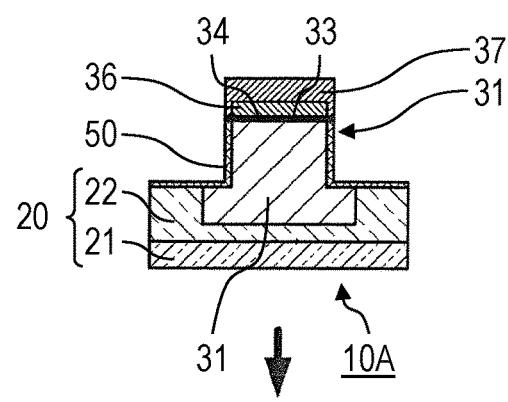
Figure 9:
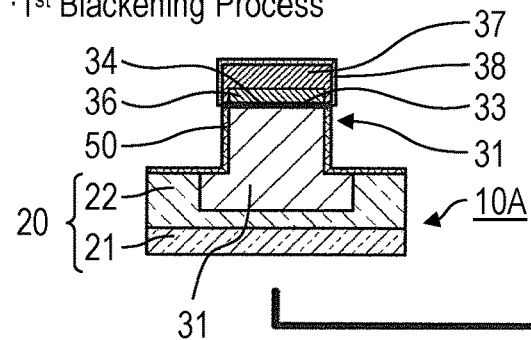
Figure 9:
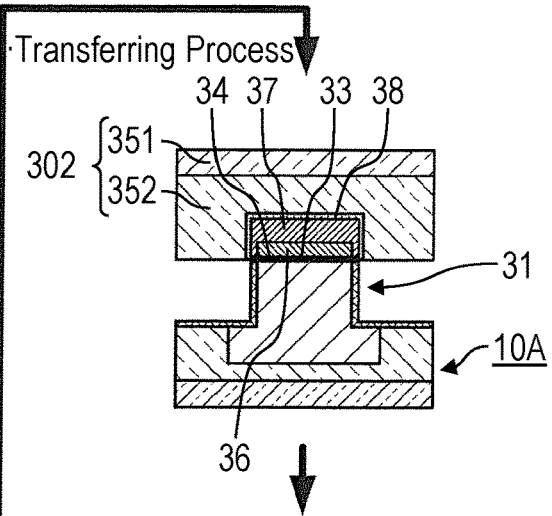
Figure 9:
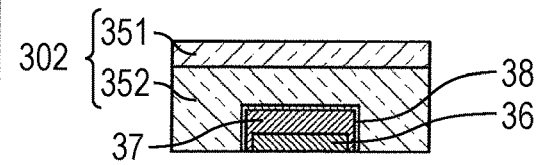
Figure 9:
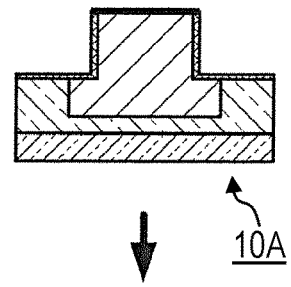
Figure 9:
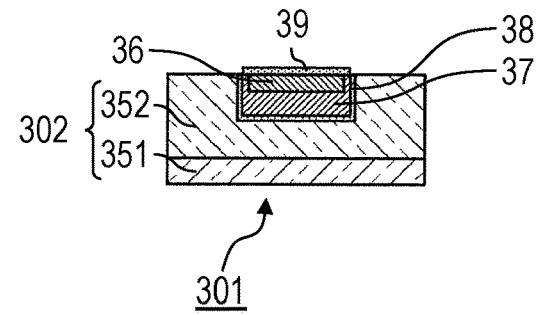

Manufacturing method 1 of a wiring board with plating-pattern plate 10A according to Embodiment 2 will be described below. FIG. 9 illustrates process of manufacturing method 1 of wiring board 301 according to Embodiment 2.

As shown in FIG. 9, in a removability-enhancing process, transfer surface 33 of transfer part 30 is subjected to a removability-enhancing treatment to form release layer 34 on transfer surface 33.

Next, in a first electroless plating process, plating-pattern plate 10A with release layer 34 formed thereon is immersed in a plating solution containing nickel so as to be subjected to electroless plating, thereby forming transfer pattern 36 on release layer 34. However, instead of the electroless plating, electrolytic plating may be performed to form transfer pattern 36 on release layer 34. In this case, the first electroless plating process is replaced by a plating process. Through this process, transfer pattern 36 is formed above transfer surface 33 of transfer part 30. That is, transfer pattern 36 is formed on transfer surface 33 of transfer part 30 via release layer 34 between transfer pattern 36 and transfer surface 33.

Next, in a second electroless plating process, plating-pattern plate 10A with transfer pattern 36 formed thereon is immersed in a plating solution containing, e.g. copper, thereby being subjected to electroless plating to form conductive pattern 37 on transfer pattern 36.

Next, in a first blackening process, blackened layer 38 is formed on conductive pattern 37.

Next, in a transferring process, substrate 302 constituting wiring board 301 is pressed against plating-pattern plate 10A including release layer 34, transfer pattern 36, conductive pattern 37, and blackened layer 38. In the transferring process, upon pressing of substrate 302 against plating-pattern plate 10A, blackened layer 38 and conductive pattern 37 are embedded in transfer resin layer 352.

Next, in a removing process, substrate 302 is peeled off from plating-pattern plate 10A. In this process, blackened layer 38, conductive pattern 37, and transfer pattern 36 are integrally secured in substrate 302. In the releasing, transfer pattern 36 is a thin-film layer containing nickel, hence having high removability. This configuration allows transfer pattern 36 to be uniformly peeled off from transfer surface 33. Since release layer 34 has been formed on plating-pattern plate 10A, transfer pattern 36 is more uniformly peeled off from transfer surface 33. That is, transfer pattern 36 is prevented from being partially left on transfer surface 33.

Next, in a second blackening process, blackened layer 39 is formed on transfer pattern 36, thereby providing wiring board 301. Manufacturing method 1 of the wiring board according to Embodiment 2 provides the same functional advantages as the manufacturing method of the wiring board according to Embodiment 1.

2-4 Manufacturing Method 2 of Wiring Board

Figure 10:
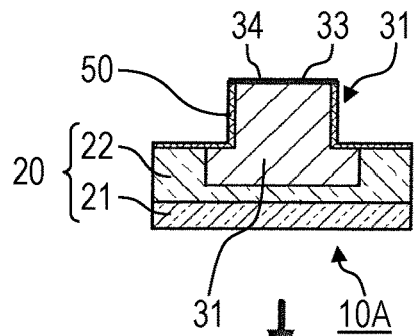
FIG. 10 illustrates another method of manufacturing the wiring board according to Embodiment 2.
Figure 10:
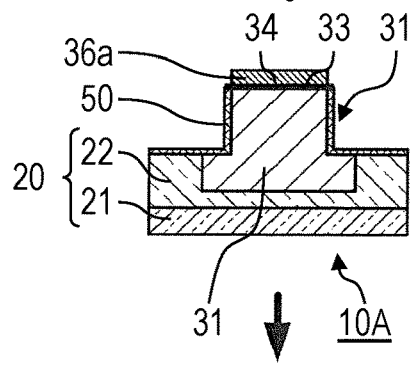
Figure 10:
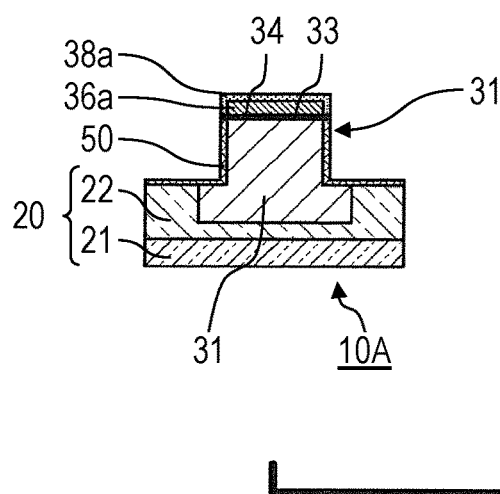
Figure 10:
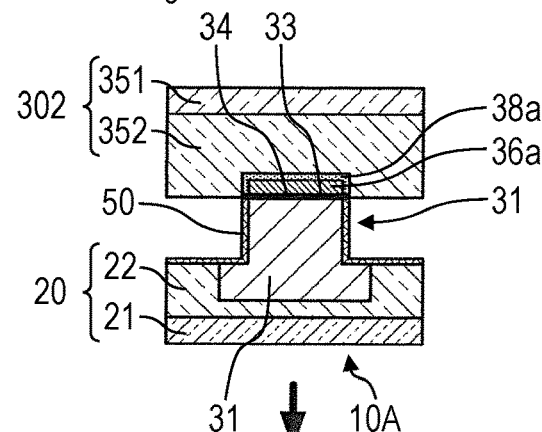
Figure 10:
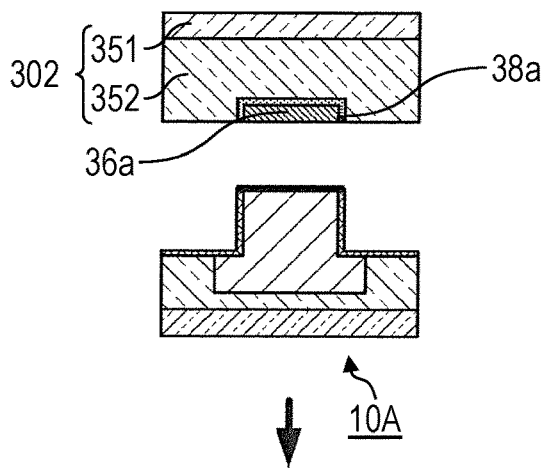
Figure 10:
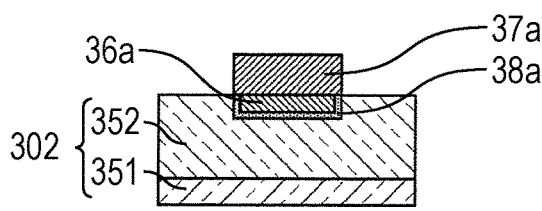
Figure 10:
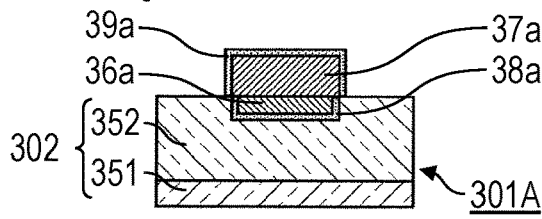

Another manufacturing method 2 of a wiring board with plating-pattern plate 10A according to Embodiment 2 will be described below. FIG. 10 illustrates processes of manufacturing method 2 of wiring board 301 according to Embodiment 2.

As shown in FIG. 10, in a removability-enhancing process, transfer surface 33 of transfer part 30 is subjected to a removability enhancing treatment to form release layer 34 on transfer surface 33.

Next, in a first electroless plating process, plating-pattern plate 10A with release layer 34 formed thereon is immersed in a plating solution containing nickel so as to be subjected to electroless plating, thereby forming transfer pattern 36 on release layer 34. Instead of the electroless plating, electrolytic plating may be performed to form transfer pattern 36 on release layer 34. In this case, the first electroless plating process is replaced by a plating process. This process provides transfer pattern 36a formed above transfer surface 33 of transfer part 30. That is, transfer pattern 36a is formed on transfer surface 33 of transfer part 30 via release layer 34 between transfer pattern 36a and transfer surface 33.

Next, in a first blackening process, blackened layer 38a is formed on transfer pattern 36a.

Next, in a transferring process, substrate 302 constituting wiring board 301 is pressed against plating-pattern plate 10A including release layer 34, transfer pattern 36a, and blackened layer 38a. In the transferring process, upon pressing of substrate 302 against plating-pattern plate 10A, blackened layer 38a and transfer pattern 36a are embedded in transfer resin layer 352.

Next, in a removing process, substrate 302 is peeled off from plating-pattern plate 10A. In this process, blackened layer 38a and transfer pattern 36a are unitarily formed in substrate 302. In the releasing, transfer pattern 36a is a thin-film layer containing nickel, hence having high removability. This configuration allows transfer pattern 36a to be uniformly peeled off from transfer surface 33. Since release layer 34 has been formed on plating-pattern plate 10A, transfer pattern 36a is more uniformly peeled off from transfer surface 33. That is, transfer pattern 36a is prevented from being partially left on transfer surface 33.

Next, in a second electroless plating process, substrate 302 with transfer pattern 36a is immersed in a plating solution containing, e.g. copper, thereby being subjected to electroless plating to form conductive pattern 37a on transfer pattern 36a. The second electroless plating process may be performed after the transfer process.

Next, in a second blackening process, blackened layer 39a is formed on conductive pattern 37a, thereby providing wiring board 301A. Manufacturing method 2 of the wiring board according to Embodiment 2 provides the same functional advantages as the manufacturing method of the wiring board according to Embodiment 1.

Exemplary Embodiment 3

3-1 Plating-Pattern Plate

Figure 11:
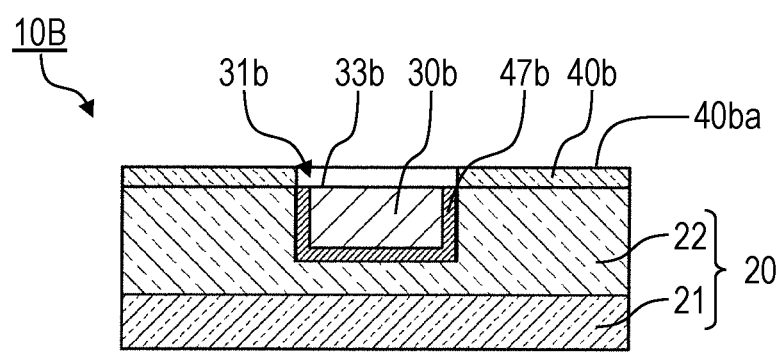
FIG. 11 is a partial cross-sectional view of a plating-pattern plate according to exemplary Embodiment 3.

FIG. 11 is a partial cross-sectional view of plating-pattern plate 10B according to Exemplary Embodiment 3 for illustrating a partial schematic configuration thereof. FIG. 11 corresponds to FIG. 3. In the following descriptions, components identical to those described in Embodiment 1 are denoted by the same reference numerals, and their explanation may be omitted.

As shown in FIG. 11, plating-pattern plate 10B includes base body 20, base metal 31b, conductive film 47b, and resin part 40b.

Unlike Embodiments 1 and 2, base metal 31b does not include projection parts 32, and serves as transfer part 30b as a whole. Conductive film 47b is provided between base metal 31b and layer 22 of base body 20. Conductive film 47b covers the lower surface and entire side surfaces of base metal 31b. Base metal 31b, i.e., transfer surface 33b of transfer part 30b is exposed. Conductive film 47b may be made of any metal having electrical conductivity sufficient for electrolytic plating. The metal that forms conductive film 47b may be copper, stainless steel, or nickel. An adhesion layer which causes conductive film 47b to adhere to layer 22 may be provided between conductive film 47b and layer 22.

Resin part 40b is placed on layer 22 of base body 20 so as to expose transfer surface 33b of transfer part 30b from the resin part. Surface 40ba of resin part 40b is disposed at a position higher than transfer surface 33b of transfer part 30b. That is, transfer surface 33b of transfer part 30b is recessed with respect to surface 40ba of resin part 40b.

3-2 Manufacturing Method of Plating-Pattern Plate

Figure 12:
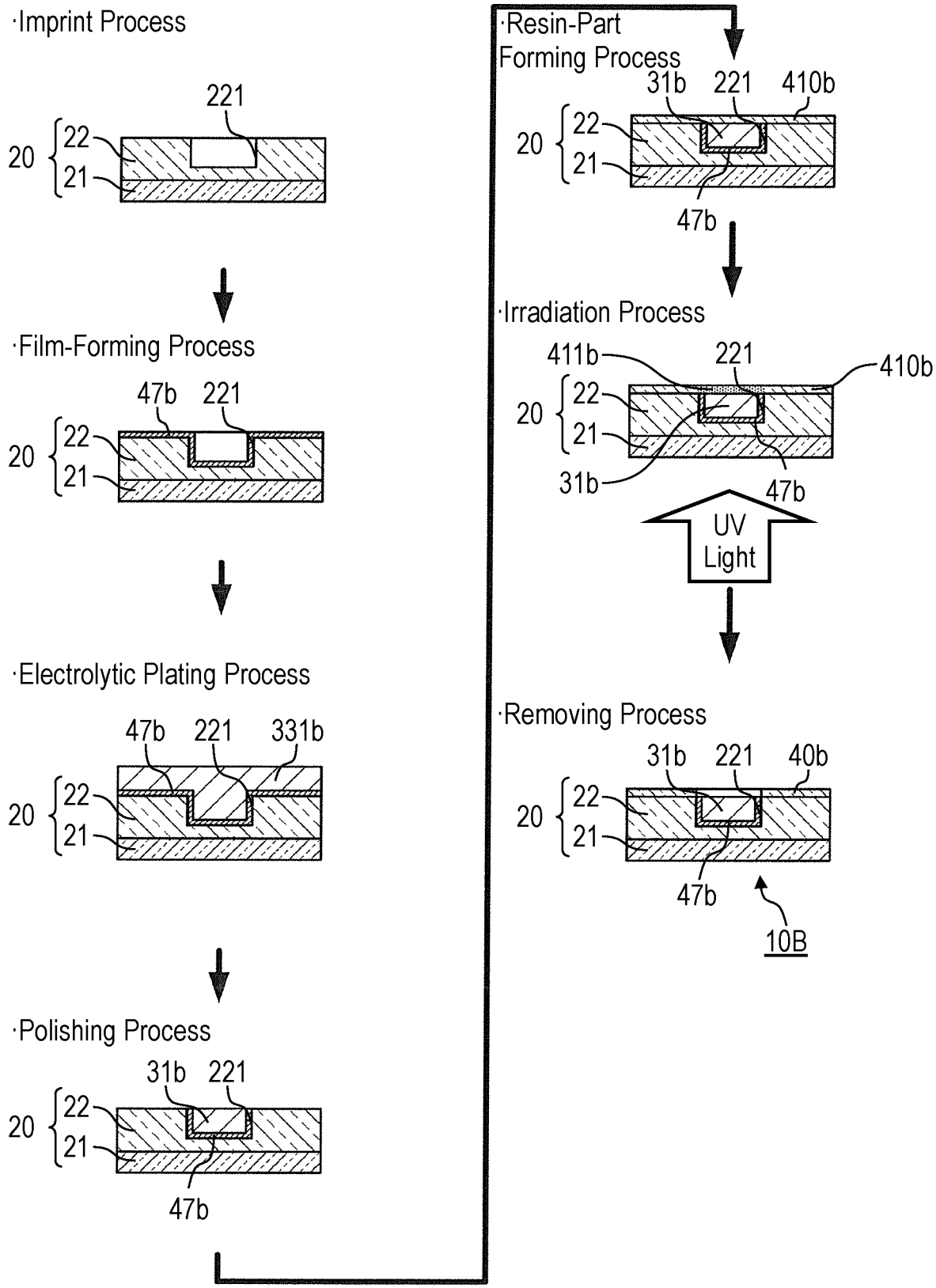
FIG. 12 illustrates a method of manufacturing the plating-pattern plate according to Embodiment 3.

A method of manufacturing plating-pattern plate 10B according to Embodiment 3 will be described below. FIG. 12 illustrates process of the manufacturing method of plating-pattern plate 10B according to Embodiment 3.

As shown in FIG. 12, in an imprint process, recess 221 into which base metal 31b is to be embedded is formed by imprinting a recess in layer 22 of base body 20.

Next, in a film-forming process, layer 22 of base body 20 is subjected to sputtering or electroless plating, thereby forming conductive film 47b. As a result, both an upper surface of layer 22 and an inner surface of recess 221 are covered by conductive film 47b.

Next, in an electrolytic plating process, base body 20 with conductive film 47b is subjected to electrolytic plating, thereby laminating, onto layer 22, metal layer 331b constituting base metal 31b.

Next, in a polishing process, both metal layer 331b and conductive film 47b are polished such that layer 22 of base body 20 is exposed, thereby allowing metal layer 331b to become base metal 31b.

Next, in a resin-part forming process, photo-curable resin 410b constituting resin part 40b is applied onto base body 20 so as to cover both layer 22 and base metal 31b.

Next, in an irradiation process, base metal 31b is irradiated with light (for example, ultraviolet light: UV light) through base body 20. As a result, a part of photo-curable resin 410b is cured. Base metal 31b blocks the light. Photo-curable resin 410b in region 411b on which base metal 31b is placed does not receive an enough amount of the light to cure the resin, thereby causing the resin in region 411b to remain uncured.

Next, in a removing process, photo-curable resin 410b is washed with a solvent to remove the uncured resin, i.e., photo-curable resin 410b in region 411b. As a result, the remaining part of photo-curable resin 410b becomes resin part 40b, thus providing plating-pattern plate 10B. Plating-pattern plate 10B according to Embodiment 3 provides the same functional advantages as plating-pattern plate 10 according to Embodiment 1.

A function of transfer surface 33b of depositing the transfer pattern by electroless plating is sufficient when the thickness of a portion of transfer part 30b including transfer surface 33b is equal to or greater than 0.1 μm. Therefore, the thickness of transfer part 30b is preferably equal to or greater than 0.1 μm.

Exemplary Embodiment 4

4-1 Plating-Pattern Plate

Figure 13:
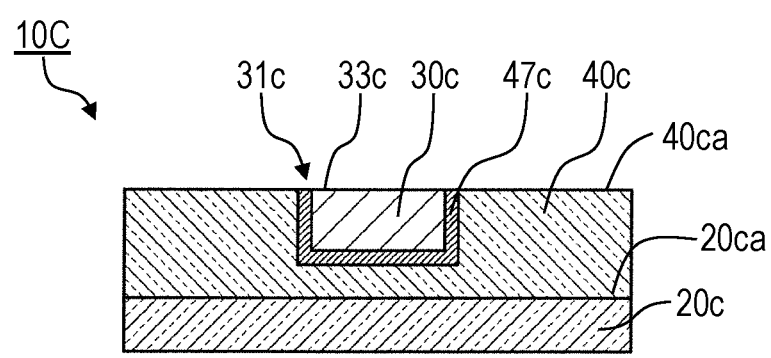
FIG. 13 is a partial cross-sectional view of a plating-pattern plate according to Exemplary Embodiment 4.

FIG. 13 is a partial cross-sectional view of plating-pattern plate 10C according to Exemplary Embodiment 4 for illustrating a partial schematic configuration thereof. FIG. 13 corresponds to FIG. 3. In the following descriptions, components identical to those of Embodiment 1 are denoted by the same reference numerals, and their explanation may be omitted.

As shown in FIG. 13, plating-pattern plate 10C includes base body 20c, base metal 31c, conductive film 47c, and resin part 40c.

Base body 20c has light-transmission properties, and is made of, e.g. glass or light-transmissive resin. Resin part 40c is placed on one main surface 20ca of base body 20c.

Unlike Embodiments 1 and 2, base metal 31c does not include projection parts 32, and serves as transfer part 30c as a whole. Conductive film 47c is provided between base metal 31c and resin part 40c. Conductive film 47c covers the lower surface and entire side surfaces of base metal 31c. Transfer surface 33c of base metal 31c is exposed. Conductive film 47c may be made of any metal having electrical conductivity sufficient for electrolytic plating. The metal that forms conductive film 47c may be copper, stainless steel, or nickel. An adhesion layer causing conductive film 47c to adhere to resin part 40c may be provided between conductive film 47c and resin part 40c.

Resin part 40c is placed on base body 20c such that transfer surface 33c of transfer part 30c is exposed. Surface 40ca of resin part 40c is flush with transfer surface 33c of transfer part 30c.

4-2 Method of Manufacturing Plating-Pattern Plate

Figure 14:
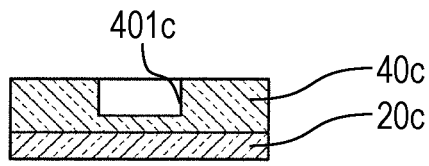
FIG. 14 illustrates process of a method of manufacturing the plating-pattern plate according to Embodiment 4.
Figure 14:
Figure 14:
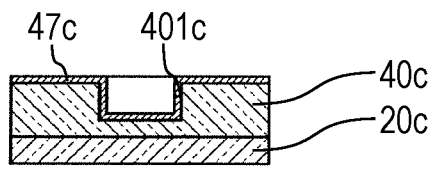
Figure 14:
Figure 14:
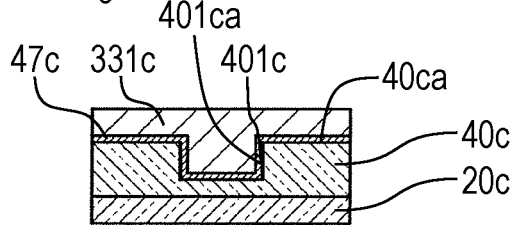
Figure 14:
Figure 14:
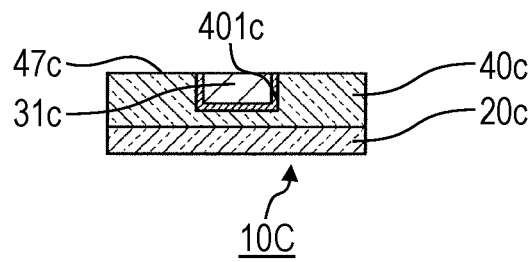

A method of manufacturing plating-pattern plate 10C according to Embodiment 4 will be described below. FIG. 14 illustrates processes of the method of manufacturing plating-pattern plate 10C according to Embodiment 4.

As shown in FIG. 14, in an imprint process, recess 401c into which base metal 31c is to be embedded is formed by imprinting a recess in resin part 40c placed on one main surface 20ca of base body 20c.

Next, in a film forming process, resin part 40c is subjected to sputtering or electroless plating, thereby forming conductive film 47c. In this process, conductive film 47c is formed on both an upper surface (surface 40ca) of resin part 40c and inner surface 401ca of recess 401c such that both the upper surface (surface 40ca) of resin part 40c and the inner surface 401ca of recess 401c are covered by conductive film 47c.

Next, in an electrolytic plating process, base body 20c with conductive film 47c and resin part 40c is subjected to electrolytic plating, thereby laminating, on conductive film 47c, metal layer 331c constituting base metal 31c.

Next, in a polishing process, both metal layer 331c and conductive film 47c are polished such that resin part 40c is exposed. This process allows metal layer 331c to become base metal 31c, thereby providing plating-pattern plate 10C. Plating-pattern plate 10C according to Embodiment 4 provides the same functional advantages as plating-pattern plate 10 according to Embodiment 1.

Others

As described above, the methods of manufacturing the plating-pattern plate and wiring board according to the present disclosure have been described on the basis of the respective exemplary embodiments; however, the present disclosure is not limited to each of the above-described exemplary embodiments.

Besides, embodiments obtained by making various modifications, which would be conceived by those skilled in the art, to the above exemplary embodiments and embodiments implemented with any combination of the constituent elements and functions in the above exemplary embodiments and each of the modifications without departing from the gist of the present disclosure are also included in the present disclosure.

A plating-pattern plate according to an aspect of the present disclosure is configured to transfer, to a substrate constituting a wiring board, a transfer pattern formed by plating. The plating-pattern plate includes a base body and transfer parts disposed on the base body. The transfer parts are for transferring the formed transfer pattern. The transfer parts are disposed on the base body electrically independent of one another.

The transfer parts 30 disposed on base body 20 electrically independent of one another, even if a defect such as a disconnection or short circuit occurs during the manufacture of plating-pattern plate 10, allows the location of such a defect to be easily found by an electrical inspection. In contrast, in the case where transfer parts 30 electrically connected to one another prevent the transfer parts from being inspected in disconnection and short circuit, resulting in the difficulty of inspection of plating-pattern plate 10 for defects.

The plating-pattern plate may include a light-transmissive base body and the transfer parts.

In this configuration, when light is applied from the base body side during the manufacturing of the plating-pattern plate, the transfer parts itself block the light. In the case where, a photoreactive resin is laminated on the plurality-of-transfer-parts side of the base body to cover all the transfer parts, portions of the photoreactive resin on the transfer parts do not react because the transfer parts block the light. This configuration allows the thus-uncured photoreactive resin to be easily removed in the subsequent steps. Therefore, it is possible to reliably expose the contribute-to-transfer transfer surface of each of the transfer parts. The transfer pattern is formed on each of the thus-exposed transfer surfaces by plating. A conductive pattern is formed on the transfer pattern. As long as each of the transfer surfaces is reliably exposed, both the transfer pattern and the conductive pattern are formed accurately, providing the fine conductive pattern with stable quality.

A plating-pattern plate according to an aspect of the present disclosure is configured to transfer, to a substrate constituting a wiring board, a transfer pattern formed by plating. The plating-pattern plate includes a light-transmissive base body and transfer parts disposed on the base body. The transfer parts are for transferring the formed transfer pattern.

When light is applied from the base body side during the manufacture of the plating-pattern plate, the transfer parts disposed on the light-transmissive base body block the light. In the case where a photoreactive resin is laminated on the transfer-parts side of the base body to cover the aforementioned transfer parts, portions of the photoreactive resin on the transfer parts do not react since the transfer parts block the light. This configuration allows the thus-uncured photoreactive resin to be removed easily in the subsequent steps. Therefore, it is possible to reliably expose the contribute-to-transfer transfer surfaces of the transfer parts. The transfer pattern is formed on the thus-exposed transfer surfaces by plating. A conductive pattern is formed on the transfer pattern. As long as the transfer surfaces have been reliably exposed, both the transfer pattern and the conductive pattern are formed accurately, providing the fine conductive pattern with a stable quality.

The transfer parts are made of alloy of iron and nickel.

This configuration enhances peelability of the transfer pattern that has been formed on the transfer part by plating. As a result, the transfer pattern is uniformly peeled off from the transfer part, resulting in an improved quality of the transfer pattern. This configuration stabilizes the quality of the fine conductive pattern that is subsequently formed on the transfer pattern.

The transfer part may be formed by electroplating.

This configuration enhances removability of the transfer pattern having been formed on the aforementioned transfer part by plating.

The transfer part may be made of alloy in which the percentage content of the total of the iron and nickel is not less than 80%.

This configuration enhances the peelability of the transfer pattern having been formed on the transfer part by plating.

The ratio of iron in the transfer part to the total of iron and nickel in the transfer part may be equal to or larger than 20%.

This configuration enhances the peelability of the transfer pattern having been formed on the transfer part by plating.

The transfer part may have a thickness equal to or larger than 0.1 μm.

This configuration enhances the peelability of the transfer pattern having been formed on the transfer part by plating.

The plating-pattern plate may include a resin part disposed outside the transfer parts in a plan view. The resin part may contain fluorine.

This configuration enhances peelability of a member having been placed on the resin part when transferring the transfer pattern. This configuration maintains the quality of the transfer pattern after having been transferred.

A method of manufacturing a wiring board according to an aspect of the present disclosure includes a plating step of forming a transfer pattern on the transfer part of the plating-pattern plate by plating, and a transfer step of transferring the transfer pattern to the substrate.

In this configuration, as described above, the transfer pattern is formed on the transfer part by plating from which the transfer surface has been reliably exposed, allowing a fine transfer pattern to be formed accurately. The transfer pattern provides a conductive pattern accurately formed on the transfer pattern. Therefore, even the fine conductive pattern has a stable quality.

The method of manufacturing the wiring board may further includes, before the plating step, a removability enhancing step of subjecting the transfer part to removability enhancing treatment.

In this configuration, the release layer allows the transfer pattern to be reliably peeled off from the transfer part. Therefore, the transfer pattern is uniformly peeled off from the transfer part, providing the transfer pattern with high quality.

The wiring board may be a wiring board for use in a touch panel.

This stabilizes the quality of the fine conductive pattern of the wiring board, a wiring board for use in a touch panel.

INDUSTRIAL APPLICABILITY

The present disclosure is useful, for example, in manufacturing a wiring board for use in a touch panel.

REFERENCE MARKS IN THE DRAWINGS 10, 10A, 10B, 10C, 10F plating-pattern plate
20, 20c base body
21 layer
22 layer
30, 30b, 30c transfer part
31, 31b, 31c base metal
32 projection part
33, 33b, 33c transfer surface
34 release layer
36, 36a transfer pattern 37, 37a conductive pattern
38, 38a, 39, 39a blackened layer
40, 40b, 40c resin part
47b, 47c conductive film
50 inorganic film
59 positive resist
221 recess
300 touch panel
301, 301A wiring board
302 substrate
310 conductive pattern
311 electrode
312 lead wiring
320 conductive pattern
321 electrode
322 lead wiring
330 flexible wiring board
331b, 331c metal layer
351 base body
352 transfer resin layer
400 electroforming substrate
401 patterning material
401c recess
402 opening
410, 410b photo-curable resin
411, 411b region
591 region

The invention claimed is:

1. A plating-pattern plate configured to transfer, to a substrate, a transfer pattern formed by plating, the plating-pattern plate comprising:
a base body; and
a plurality of transfer parts disposed on the base body, wherein
each of the plurality of transfer parts has a transfer surface configured to have the transfer pattern to be formed on the transfer surface by plating,
the plurality of transfer parts are disposed electrically independent of one another on the base body, and
the each of the plurality of transfer parts includes:
a first metal layer having the transfer surface; and
a second metal layer supporting the first metal layer, the second metal layer including one or more layers.

2. The plating-pattern plate of claim 1, wherein the base body is light-transmissive.

3. The plating-pattern plate of claim 1, wherein the transfer surfaces of the each of the plurality of transfer parts contain iron and nickel.

4. The plating-pattern plate of claim 3, wherein the plurality of transfer parts are formed by electroplating.

5. The plating-pattern plate of claim 3, wherein the plurality of transfer parts is made of alloy in which a percentage content of a total of iron and nickel is not less than 80%.

6. The plating-pattern plate of claim 5, wherein a ratio of the iron of the plurality of transfer parts to the total of the iron and the nickel the plurality of transfer parts is not less than 20%.

7. The plating-pattern plate of claim 1, wherein, the plurality of transfer parts have thicknesses equal to or larger than 0.1 μm.

8. The plating-pattern plate of claim 1, wherein the first metal layer contains iron and nickel.

9. The plating-pattern plate of claim 1, further comprising a resin part disposed outside the plurality of transfer parts in a plan view, the resin part containing fluorine.

10. A method of manufacturing a wiring board, the method comprising:
preparing a plating-pattern plate of claim 1;
forming the transfer pattern on the transfer surfaces of the each of the plurality of transfer parts of the plating-pattern plate by plating; and
transferring the transfer pattern to the substrate.

11. The method of claim 10, wherein said forming the transfer pattern comprises forming the transfer pattern on the transfer surface of the each of the plurality of transfer parts of the plating-pattern plate by electroless plating.

12. The method of claim 10, further comprising forming a conductive pattern on the transfer pattern by electroless plating.

13. The method of claim 10, further comprising subjecting the transfer surface of the each of the plurality of transfer parts of the plating-pattern plate to a removability-enhancing process before said forming the transfer pattern.

14. The method of claim 10, wherein the wiring board is a wiring board for a touch panel.

15. A plating-pattern configured to transfer, to a substrate, a transfer pattern formed by plating, the plating-pattern plate comprising:
a base body which is light-transmissive; and
a transfer part disposed on the base body, wherein
the transfer part has a transfer surface configured to have the transfer pattern to be formed on the transfer surface by plating, and
the transfer part includes:
a first metal layer having the transfer surface; and
a second metal layer supporting the first metal layer, the second metal layer including one or more layers.

16. The plating-pattern plate of claim 15, wherein the transfer surface of the transfer part contains iron and nickel.

17. The plating-pattern plate of claim 15, wherein the transfer part is formed by electroplating.

18. The plating-pattern plate of claim 15, wherein the transfer part is made of alloy containing iron and nickel at a of a total of iron and nickel is equal to or larger than 80%.

19. The plating-pattern plate of claim 18, wherein a ratio of iron of the transfer part to the total of iron and the nickel of the transfer part is equal to or larger than 20%.

20. The plating-pattern plate of claim 15, wherein the transfer part has a thickness equal to or larger than 0.1 μm.

21. The plating-pattern plate of claim 15, wherein the first metal layer contains iron and nickel.

22. The plating-pattern plate of claim 15, further comprising a resin part disposed outside the transfer part in a plan view, the resin part containing fluorine.

23. A method of manufacturing a wiring board, the method comprising the steps of:
preparing a plating-pattern plate of claim 15;
forming the transfer pattern on the transfer surface of the transfer part of the plating-pattern plate by plating; and
transferring the transfer pattern to the substrate.

24. The method of claim 23, wherein said forming the transfer pattern comprises forming the transfer pattern on the transfer surface of the transfer part of the plating-pattern plate by electroless plating.

25. The method of claim 23, further comprising forming a conductive pattern on the transfer pattern by electroless plating.

26. The method of claim 23, further comprising subjecting the transfer surface of the transfer part of the plating-pattern plate to a removability enhancing process before said forming the transfer pattern.

27. The method of claim 23, wherein the wiring board is a wiring board for a touch panel.

\* \* \* \* \*